US007971124B2

(12) United States Patent  
Spanel et al.

(10) Patent No.: US 7,971,124 B2
(45) Date of Patent: Jun. 28, 2011

(54) APPARATUS AND METHOD FOR DISTINGUISHING SINGLE BIT ERRORS IN MEMORY MODULES

(75) Inventors: Carol Spanel, San Jose, CA (US); Andrew Dale Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1061 days.

(21) Appl. No.: 11/757,162

(22) Filed: Jun. 1, 2007

(65) Prior Publication Data

US 2008/0301529 A1  Dec. 4, 2008

(51) Int. Cl.
*G11C 29/00* (2006.01)
(52) U.S. Cl. .......................................................... 714/768
(58) Field of Classification Search .................. 714/746, 714/763–764, 768, 704
See application file for complete search history.

(56) References Cited

U.S. PATENT DOCUMENTS

| | | | |
|---|---|---|---|
| 3,742,459 A | 6/1973 | Looschen | |
| 4,255,808 A * | 3/1981 | Schaber | 714/764 |
| 4,337,664 A | 7/1982 | Kipp et al. | |
| 4,371,930 A | 2/1983 | Kim | |
| 4,570,217 A | 2/1986 | Allen et al. | 364/188 |
| 5,825,201 A | 10/1998 | Kolze | |
| 6,711,703 B2 * | 3/2004 | MacLaren et al. | 714/704 |
| 7,197,670 B2 | 3/2007 | Boatright et al. | 714/47 |
| 7,320,100 B2 | 1/2008 | Dixon et al. | 714/758 |
| 7,631,228 B2 * | 12/2009 | Brittain et al. | 714/704 |

OTHER PUBLICATIONS

Office Action for U.S. Appl. No. 11/757,221 dated Dec. 15, 2010.

* cited by examiner

*Primary Examiner* — Shelly A Chase
(74) *Attorney, Agent, or Firm* — Kunzler Needham Massey & Thorpe

(57) ABSTRACT

An apparatus, system, and method are disclosed for distinguishing correctable bit errors in memory. A bit error detection module detects a correctable bit error in memory. The correctable bit error is correctable using error-correcting code ("ECC"). A comparison module compares an error location indicator with a stored error location indicator. The error location indicator is a location of the correctable bit error. The stored error location indicator includes to at least one previously stored error location indicator of a previously detected correctable bit error. A storage module stores the error location indicator in response to the comparison module determining that the error location indicator differs from a stored error location indicator. A bit error counter module increases a random bit error counter if the comparison module determines that the error location indicator differs from a stored error location indicator and does not increase the random bit error counter otherwise.

20 Claims, 11 Drawing Sheets

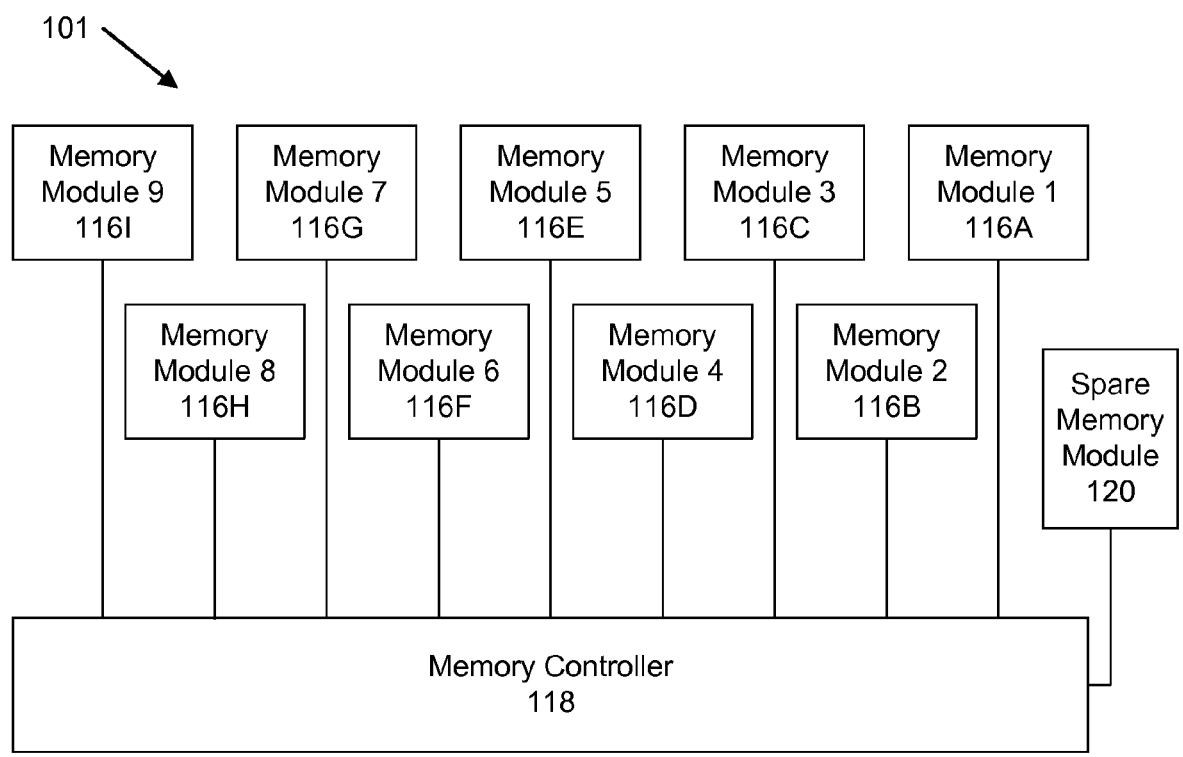
FIG. 1B     (Prior Art)

US 7,971,124 B2

APPARATUS AND METHOD FOR DISTINGUISHING SINGLE BIT ERRORS IN MEMORY MODULES

RELATED APPLICATIONS

This Application is related to U.S. patent application Ser. No. 11/757,221, filed on Jun. 1, 2007, titled APPARATUS AND METHOD FOR DISTINGUISHING TEMPORARY AND PERMANENT ERRORS IN MEMORY MODULES for Carol Spanel, et al., which is herein incorporated by reference.

BACKGROUND OF THE INVENTION

1. Field of the Invention

This invention relates to error correction in memory and more particularly relates to distinguishing between temporary and permanent bit errors in memory modules.

2. Description of the Related Art

Computer memory is an essential element of any computing system and data integrity is vitally important to prevent computing errors. Computer memory may be static, where data is retained when the computer is not operating, or dynamic, where data is lost when the computer is not operating. Random access memory ("RAM") is a typical form of dynamic memory that loses its contents when a computer is shut down. Hard disk drives, compact disc ("CD") drives, optical drives, and the like are forms of static memory that retain data when no power is applied.

FIG. 1A is a simplistic diagram illustrating how memory 100 may be organized. The memory 100 typically includes many cells 102 where each cell 102 represents a single bit. A common memory structure includes cells 102 organized into some type of matrix with columns 104 and rows 106. Typically, either the columns 104 or the rows 106 represent bits stored together as a particular memory address and often is sized to match a number of channels or lines of a data bus. In FIG. 1A for simplicity eight columns 106 of a particular row 104 represent eight bits of data stored in one memory location. A memory location. A memory location often includes 16 bits, 32 bits, 64 bits, etc., stored together in a memory location accessible by a memory address. For example, a row 104 of memory 100 may include 64 bits of data for a 64 bit processor using a 64 bit data bus. Often a memory location is physically part of a memory module and several memory modules operate together as a complete memory location of a suitable number of bits. Memory modules will be explained further in relation to FIG. 1B.

For the simplistic memory 100 shown in FIG. 1A, each row 104 represents a separate memory address with 8 bits of data, each stored in a separate cell 102. One method of reading and writing data to a particular memory location is to select a particular row 104 and then to store either a "1" or a "0" in each cell 102 of the row 104. Selecting a row 104 may require some type of wire 108 or data transmission pathway to activate the row and another wire 110 or data transmission pathway to each cell 102 in the row 104. If a cell 102 is made up of transistors, a row wire 108 may enable transistors within the row 104 and column wires 108 may be used to write data to each cell 102 of the row 104. For example, data may be read into row R1 such that the cells 102 of row R1 represent bits with values of 0010 1101.

It is not uncommon for data stored in memory to occasionally have an error. For example, a particular cell 102 may have an error. FIG. 1A depicts a cell 112 with an error in row R2 at the second bit of the row, corresponding to column C2 114. The error may be temporary or permanent. For example, an error may be due to some random voltage fluctuation, static discharge, alpha particle, etc., that causes a cell 112 to register a different value than intended. A permanent error may be caused by failure of a transistor, gate, discontinuity or failure in the memory material, etc., that may cause a cell 112 to remain in one state regardless of what is written to the cell 112.

Another type of error may cause a data transmission pathway from a particular cell 112 to be unresponsive to the contents of the cell 112. The data transmission pathway may access a number of cells 102. For example, the wire or data transmission pathway 114 corresponding to column C2 114 is depicted in FIG. 1A may be in error. Reading any address of the memory 100 may result in a "1" on column C2 114 regardless of the stored contents in the memory 100. This data line error may again be temporary or permanent. A data line error 114 may be considered worse than a cell error 112 because every memory location read using the data line 114 has a 50/50 chance of being in error.

Another type of memory error is a memory module error. FIG. 1B is a depiction of a system 101 of memory modules operating to provide 64-bit memory locations. The system 101 includes memory modules 1-9 116 in operation connected to a memory controller 118. A spare memory module 120 is also connected to the memory controller 118. Memory modules 1-8 116A-H each contribute 8 bits of memory, as depicted in FIG. 1A, to an addressable 64-bit memory location. Memory module 9 116I may be used to store error correction code (described below). The system 101 may include a spare memory module 120 that may be activated in case of failure of another memory module 116. For example, if memory module 1 116A fails, the spare memory module 120 may be quickly brought online to take over for memory module 1 116A. Detecting and correcting cell errors 112, data line errors 114, and memory module 116 errors is crucial to data integrity.

Computer memory often includes some type of error detection and correction to maintain integrity of data stored in the memory. Numerous error detection methods are and have been used to detect errors in data stored in memory. Some of the error detection methods allow correction of errors without requiring the source of the data to resend the data in error. Many commonly used error detection and correction methods can detect errors in two bits of a particular memory location and can correct single-bit errors.

Error-correcting code ("ECC") may be the product of an error detection and correction scheme. Typically ECC for a particular set of data is stored with the data. For example, for a 64-bit system with 64-bit memory, a particular error detection and correction scheme may generate ECC based on 64 bits residing on or to be stored in the memory. The ECC may include a few extra bits that may be stored with the corresponding 64 bits of data. Examples of error detection and correction schemes that generate ECC include Hamming code, BCH code, Reed-Solomon code, Reed-Muller code, Binary Golay code, convolution code, and turbo code.

Computer, peripherals, application-specific integrated circuits ("ASICs"), etc. with memory that includes ECC stored with data often count recoverable errors. Recoverable errors are errors that can be corrected using the ECC associated with the data. For an error detection and correction scheme that can correct single bit errors, any data with a single bit error can be corrected using the ECC regardless of whether the cause of the error is temporary or permanent. A bit error count for recoverable errors may be used to signal a deterioration of the memory or an associated memory controller. The bit error count may be used to generate an error message of some type and may be used to preemptively signal a need to take corrective action, such as maintenance, memory replacement, etc. Non-recoverable errors typically cause more disruption and are usually dealt with on a more immediate basis.

A bit error count typically increments slowly for random events caused by temporary errors during normal operation, but then may increment more quickly as memory or a memory controller starts to degrade. By contrast, a single permanent bit error may increment the bit error count quickly. This would occur if the single bit permanent error was accessed frequently. A permanent single bit error condition may generate a lot of errors if the memory address containing the single bit error is accessed frequently. A bit error count may then increase quickly signaling a problem with the memory. However, the memory may be functioning correctly even though the single memory cell is incorrect.

One theory of memory management is that the memory should continue to operate because any errors in data caused by the permanent memory cell error can be corrected by ECC. In this case the reliability of the memory has been reduced because a second error at the memory address containing the permanent error is not correctable using typical ECC methods. However, the current state of the art is unable to distinguish between single single permanent errors and single random, temporary errors. In addition, the current state of the art is unable to distinguish bit line errors and memory module errors from other errors.

SUMMARY OF THE INVENTION

From the foregoing discussion, it should be apparent that a need exists for an apparatus, system, and method that distinguish between permanent and temporary single bit errors. Beneficially, such an apparatus, system, and method would not increment a random bit error counter when an error is determined to be from a location of a previous error. The apparatus, system and method would store single bit error location indicators and may include a counter to keep track of how often a particular error location indicator with a single bit error is accessed. The apparatus, system, and method may also keep track of which bit in a memory location has an error to allow determination of a bit line error and which memory module has an error to allow determination of a memory module error.

The present invention has been developed in response to the present state of the art, and in particular, in response to the problems and needs in the art that have not yet been fully solved by currently available bit error detection methods. Accordingly, the present invention has been developed to provide an apparatus, system, and method for distinguishing correctable single bit errors in memory that overcome many or all of the above-discussed shortcomings in the art.

The apparatus for distinguishing correctable single bit errors in memory is provided with a plurality of modules configured to functionally execute the necessary steps of detecting a correctable bit error, comparing an error location indicator of the error with a stored error location indicator, and incrementing a random bit error counter only if the location of the detected bit error does not match any stored error location indicator. These modules in the described embodiments include a bit error detection module that detects a correctable bit error in a data memory. The correctable bit error is correctable using error-correcting code ("ECC"). The apparatus includes a comparison module that compares an error location indicator with a stored error location indicator. The error location indicator includes an indication of location in the data memory of the correctable bit error and the stored error location indicator corresponding to at least one previously stored error location indicator of a indicator of a previously detected correctable bit error.

The apparatus includes a storage module that stores the error location indicator in response to the comparison module determining that the error location indicator differs from a stored error location indicator. The apparatus includes a random bit error counter module that increases a random bit error counter in response to the comparison module determining that the error location indicator differs from a stored error location indicator and does not increase the random bit error counter in response to the comparison module determining that the error location indicator matches a stored error location indicator.

The apparatus, in one embodiment, includes an error counter module that increases an error counter corresponding to the error location indicator in response to the comparison module determining that the error location indicator matches a stored error location indicator. In another embodiment, the bit error detection module detects a correctable bit error in response to a memory READ operation where the memory READ operation is generated during normal operation of a processor in communication with the data memory.

In one embodiment, the apparatus includes a random bit error threshold module that generates an error in response to the random bit error counter reaching a random bit error threshold. In another embodiment, the apparatus includes an error threshold module that generates an error in response to the error counter reaching an error threshold. In another embodiment, the storage module stores the error address in a register. The register may be a first-in first-out ("FIFO") register including capacity to store a plurality of error addresses.

In a particular embodiment, the error location indicator is an error address and the stored error location indicator is a stored error address. In the embodiment, the comparison module includes a memory cell comparison module that compares the error address with a stored error address. The error address includes a location in the data memory of the correctable bit error and the stored error address corresponds to at least one previously stored address of a previously detected correctable bit error. In the embodiment, the storage module includes a memory address storage module that stores the error address in response to the memory cell comparison module determining that the error address differs from a stored error address.

Also in the embodiment, the error counter is a memory cell error counter and the error counter module includes a memory cell error counter module that increases the memory cell error counter in response to the memory cell comparison module determining that the error address matches a stored error address. In the embodiment, the apparatus includes a memory cell error threshold module that generates an error in response to the memory cell error counter reaching a memory cell error threshold. In a further embodiment, the memory cell error counter includes one of a plurality of memory cell error counters. Each memory cell error counter corresponds to a stored error address and the memory cell error counter module increases a memory cell error counter corresponding to the stored error address that matches the error address In another particular embodiment, the error location indicator is an error bit location and the bit error detection module includes a bit line error detection module that detects an error bit location of the correctable bit error relative to bits in a memory location corresponding to the correctable bit error. In the embodiment the stored error location indicator is a stored error bit location and the comparison module includes a bit line comparison module that compares the error bit location with a stored error bit location. The stored error bit location corresponds to at least one previously stored error bit location of a previous correctable bit error.

In the embodiment the storage module includes a bit line storage module that stores the error bit location in response to the bit line comparison module determining that the error bit location differs from a stored error bit location. Also in the embodiment, the error counter is a bit line error counter and the error counter module includes a bit line error counter module that increases the bit line error counter in response to the bit line comparison module determining that the error bit location matches a stored error bit location. The apparatus of the apparatus of the embodiment includes a bit line error threshold module that generates an error in response to the bit line error counter reaching a bit line error threshold.

In one variation of the embodiment, the random bit error counter module does not increase the random bit error counter in response to the bit line comparison module determining that the bit location matches a stored bit location. In another variation of the embodiment, the random bit error counter module increases the random bit error counter in response to the bit line comparison module determining that the bit location matches a stored bit location.

In another particular embodiment, the bit error detection module further includes a memory module error detection module that detects which memory module includes the correctable bit error. The memory module with the correctable bit error includes one of a plurality of memory modules operating together as an addressable memory location in the data memory. In the embodiment the error location indicator is a memory module number and the stored error location indicator is a stored memory module number. The comparison module includes a memory module comparison module that compares the memory module number of the memory module with the correctable bit error with a stored memory module number. The stored memory module number corresponds to at least one previously stored memory module number of a previous correctable bit error.

In the embodiment, the storage module includes a memory module storage module that stores the memory module number of the memory module in error in response to the memory module comparison module determining that the memory module number differs from a stored memory module number. Also in the embodiment, the error counter is a memory module error counter and the error counter module includes a memory module error counter module that increases the memory module error counter in response to the memory module comparison module determining that the memory module number matches a stored memory module number. The apparatus of the embodiment also includes a memory module error threshold module that generates an error in response to the memory module error counter error counter reaching a memory module error threshold.

In another embodiment, the bit error detection module, the comparison module, the storage module, the error counter module, and the random bit error counter are implemented in hardware and logic without code for the modules being assembled from a high level programming language and then executed on a processor.

A method of the present invention is also presented for distinguishing correctable single bit errors in memory. The method in the disclosed embodiments substantially includes the steps necessary to carry out the functions presented above with respect to the operation of the described apparatus. In one embodiment, the method includes detecting a correctable bit error in a data memory. The correctable bit error is correctable using ECC. The method includes comparing an error address with a stored error address. The error address includes a location in the data memory of the correctable bit error and the stored error address corresponds to at least one previously stored address of a previously detected correctable bit error.

The method includes storing the error address in response to determining that the error address differs from a stored error address. The method includes increasing a memory cell error counter corresponding to the error address in response to determining that the error address matches a stored error address. The method includes increasing a random bit error counter in response to determining that the error address differs from a stored error address and not increasing the random bit error counter in response to determining that the error address matches a stored error address.

In one embodiment, the method includes detecting an error bit location of the correctable bit error relative to bits in a memory location corresponding to the correctable bit error and comparing the error bit location with a stored error bit location. The stored error bit location corresponds to at least one previously stored error bit location of a previous correctable bit error. The method of the embodiment includes storing the error bit location in response to determining that the error bit location differs from a stored error bit location and increasing a bit line error counter in response to determining that the error bit location matches a stored error bit location.

Another method of the present invention is presented for distinguishing correctable single bit errors in memory. The method in the disclosed embodiments substantially includes the steps necessary to carry out the functions presented above with respect to the operation of the described apparatus. The method includes detecting a correctable bit error in a data memory, the correctable bit error correctable using ECC. The method also includes detecting an error bit location of the correctable bit error relative to bits in a memory location corresponding to the correctable bit error and comparing the error bit location with a stored error bit location. The stored error bit location corresponds to at least one previously stored error bit location of a previous correctable bit error.

The method includes storing the error bit location in response to determining that the error bit location differs from a stored error bit location and increasing a bit line error counter in response to determining that the error bit location matches a stored error bit location. The method includes increasing a random bit error counter in response to determining that an error address differs from a stored error address and not increasing the random bit error counter in response to determining that the error address matches a stored error address. The error address includes a location in the data memory of the correctable bit error and the stored error address corresponds to at least one previously stored address of a previously detected correctable bit error.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 1B is a depiction of memory modules operating to provide 64-bit memory locations;

DETAILED DESCRIPTION OF THE INVENTION

Figure 1A:
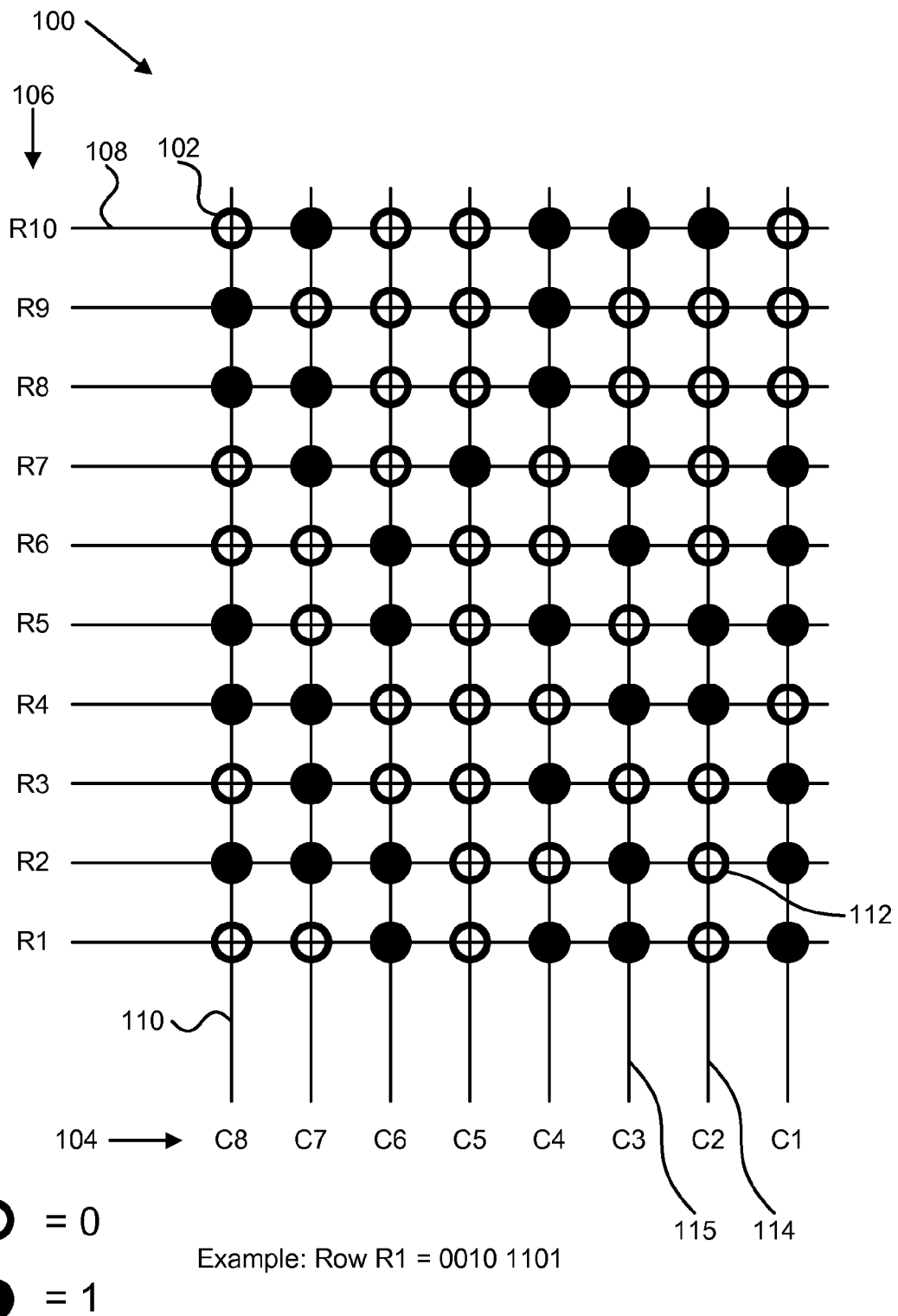
FIG. 1A is a schematic block diagram illustrating a simplistic representation of memory consistent with the prior art.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. Software modules are stored on a computer readable media, such as memory, disk drives, removable data storage media, and the like. Modules may also comprise hardware and software where the software portion of the module is stored on a computer readable medium. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations on computer readable media which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a signal bearing medium may take any form capable of generating a signal, causing a signal to be generated, or causing execution of a program of machine-readable instructions on a digital processing apparatus. A signal bearing medium may be embodied by a transmission line, a compact disc, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 2:
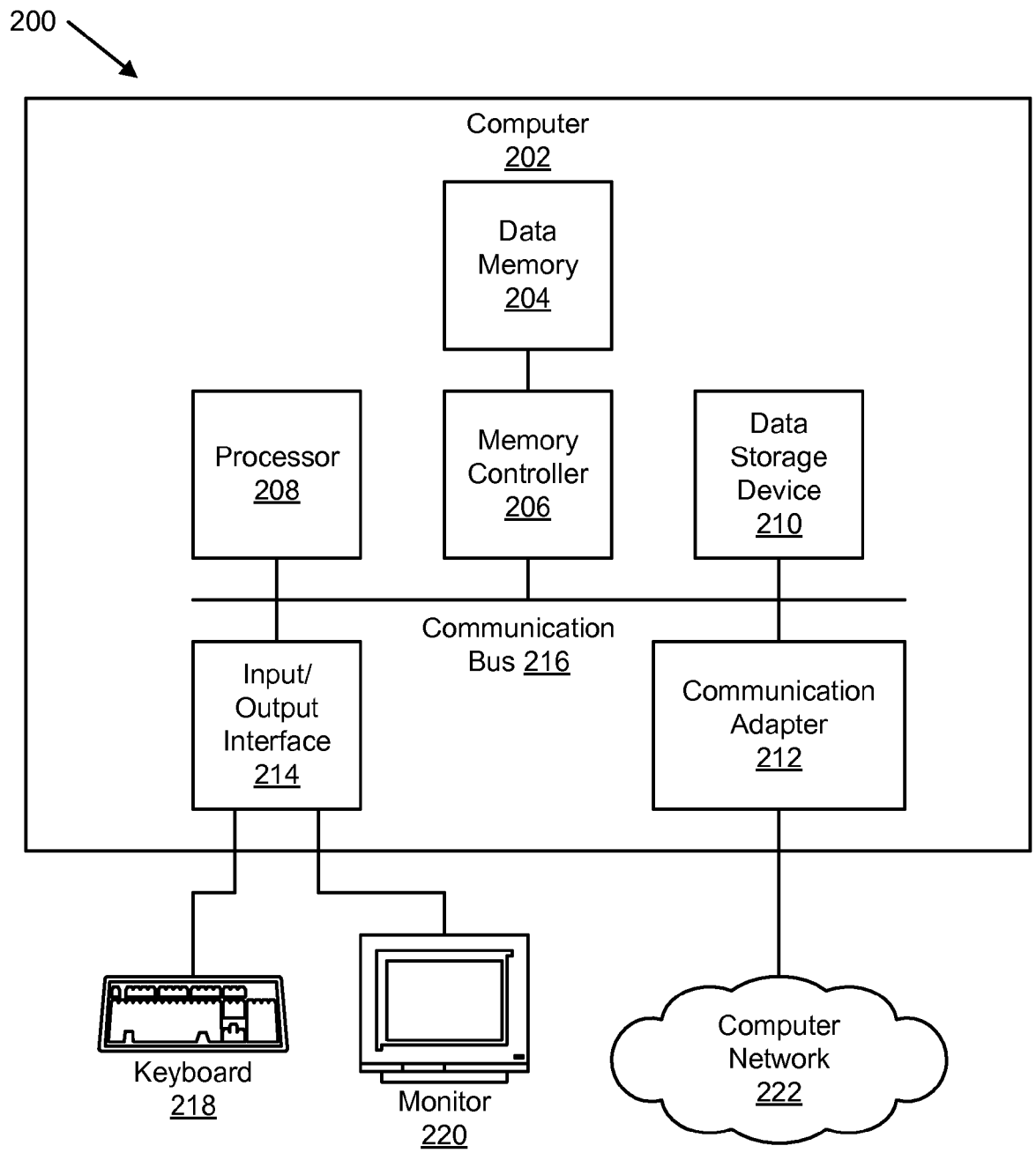
FIG. 2 is a schematic block diagram illustrating one embodiment of a system for distinguishing correctable single bit errors in memory in accordance with the present invention.

FIG. 2 is a schematic block diagram illustrating one embodiment of a system 200 for distinguishing correctable single bit errors in memory in accordance with the present invention. FIG. 2 includes a computer 202 with a data memory 204, a memory controller 206, a processor 208, a data storage device 210, a communication adapter 212, an input/output interface 214, and a communication bus 216. The input/output interface 214 is connected to a keyboard 218 and a monitor 220 and the communication adapter 212 is connected to a computer network 222. The computer 202 and other components are described below.

The system 200 includes a computer 202. The computer 202 may be any computing device with data memory 204 that includes error-correcting code ("ECC"). In certain embodiments, the computer 202 may be a mainframe computer, a storage controller, a desktop computer, a laptop computer, a workstation, a server, a personal digital assistant ("PDA"), and the like. In other embodiments, the computer 202 may be an application-specific integrated circuit ("ASIC") in an electronic or other device. For example, the computer 202 may be an ASIC in a cell phone, a portable media player ("PMP"), a handheld gaming device, a global positioning system ("GPS") device, a camera, etc. The computer 202, in other embodiments, may include peripheral devices, such as a printer, with data memory that includes ECC and a processor. One of skill in the art will recognize other computers 202 with data memory 204 that includes ECC.

The computer 202 includes data memory 204 with ECC. The data memory 204, in one embodiment, includes random access memory ("RAM") such as dynamic RAM, digital video disc ("DVD") RAM, non-volatile RAM ("NVRAM"), synchronous dynamic RAM ("SDRAM"), static RAM, etc. In another embodiment, the data memory 204 includes flash memory, cache, etc. In yet another embodiment, the data memory 204 includes computer memory in a data storage device 210, such as a hard disk drive, optical drive, etc., a removable storage device, such as a tape, compact disc ("CD"), DVD, external hard drive, flash memory dongle, etc. One of skill in the art will recognize other data memory 204 that includes ECC.

In certain embodiments, the computer 202 includes a memory controller 206. Typically, the memory controller 206 controls data flow to the data memory 204. The memory controller 206 may generate ECC using an error detection and correction scheme. Examples of error detection and correction schemes that generate ECC include Hamming code, BCH code, Reed-Solomon code, Reed-Muller code, Binary Golay code, convolution code, and turbo code, and the like. One of skill in the art will recognize other error detection and correction schemes that generate ECC.

Typically, ECC is generated for a specific segment of data and is typically stored with the data. For example, if 64 bits of data are stored as one memory location, the ECC may be stored with the 64 bits of data. For example, one 8-bit memory module 116I may contain ECC for eight memory modules 116A-H operating together as an addressable 64-bit memory location. In another example, ECC is stored with each memory module 116 or memory segment. If, for example, memory is stored in 16 bit segments, extra bits for each 16-bit segment may be dedicated for ECC. In one embodiment, ECC is stored in the data memory 204 with the data used to generate the ECC. In another embodiment, ECC is stored separately from the data in memory 204 used to generate the ECC. One of skill in the art will recognize other ways to generate and store ECC.

In one embodiment, a memory controller 206 communicates with a processor 208 over a communication bus 216 to control data flow to the data memory 204 as well as other memory related functions. In another embodiment, one or more functions of a memory controller 206 are distributed in one or more other devices, such as the processor 208, a chip set (not shown), a motherboard (not shown), etc. One of skill in the art will recognize other functions, features, and implementations of a memory controller 206.

The computer 202 includes one or more processors 208. The processor 208 typically executes instructions and communicates with the data memory 204 and other devices. The processor 208 may be incorporated in numerous forms depending upon the computer 202 type. The processor 208 typically accesses and writes data to locations in the data memory 204. The data may be instructions, application data, etc. As the processor 208 writes data to the data memory 204, typically the memory controller 206 generates ECC to be stored with the data to ensure data integrity.

When the processor 208 reads data from the data memory 204, typically the memory controller 206 verifies data integrity using the associated ECC. If a single-bit error is detected, the ECC is used to correct the error prior to transmitting the data. If two bits are in error, typically the ECC may be used to detect the error. In another embodiment, an error detection and correction scheme may detect more than two bits in error and may correct more than a single bit error. In one embodiment, the memory controller 206 distinguishes correctable single bit errors in memory in accordance with the present invention. Implementations of the present invention in a memory controller 206 are described below in relation to FIGS. 3 and 4.

In one embodiment, the computer 202 includes one or more data storage devices 210. For example, the computer 202 may include a hard disk drive. In other embodiments, the computer 202 may include a CD drive, a DVD drive, a tape drive, flash memory, an optical drive, etc. The data storage device 210 may include ECC and beneficially may allow distinguishing correctable single bit errors in accordance with the present present invention. One of skill in the art will recognize other forms, combinations, and implementations of data storage devices 210.

The computer 202, in one embodiment, includes a communication adapter 212. The communication adapter 212 typically facilitates communication with one or more computer networks 222, such as a local area network ("LAN"), wide area network ("WAN"), the Internet, a storage area network ("SAN"), and the like. The communication adapter 212 typically allows communication with other computers and devices through a computer network 222. In one embodiment, the communication adapter 212 allows the computer 202 to communicate with a peripheral device, such as a scanner, a printer, etc. One of skill in the art will recognize other ways that a computer 202 may communicate through a communication adapter 212.

The computer 202, in one embodiment, includes an input/output adapter 214 capable of connecting to a keyboard 218, monitor 220, mouse (not shown), etc. The input/output adapter 214 typically differs greatly depending upon how the computer 202 is implemented. In one embodiment, the monitor 220 is a display of some type integrated into the computer 202. For example, a cell phone, PMP, PDA, etc., may include a small display screen or other indicator lights to communicate to data and status of the computer 202 to a user. In another embodiment, the input/output adapter 214 connects to buttons, keys, a touch screen, a touch pad, etc., to allow a user to control the computer 202. In other embodiments, the input/output adapter 102 may facilitate connection to speakers, headphones, peripheral devices, such as printers, scanners, etc., or other input/output devices. One of skill in the art will recognize other ways that an input/output adapter 214 may facilitate control and communication with a particular implementation of a computer 202.

Typically the computer 202 includes one or more communication busses 216 configured to facilitate data and instruction flow within the computer 202. For example, a communication bus 216 may connect processors 208, data memory 204 (possibly through a memory controller 206), data storage devices 210, communication adapters 212, input/output adapters 214, etc. within the computer 202. In one embodiment, a communication bus 216 may connect external devices, such as small computer system interface ("SCSI") devices. One of skill in the art will recognize other forms of a communication bus 216.

Figure 3:
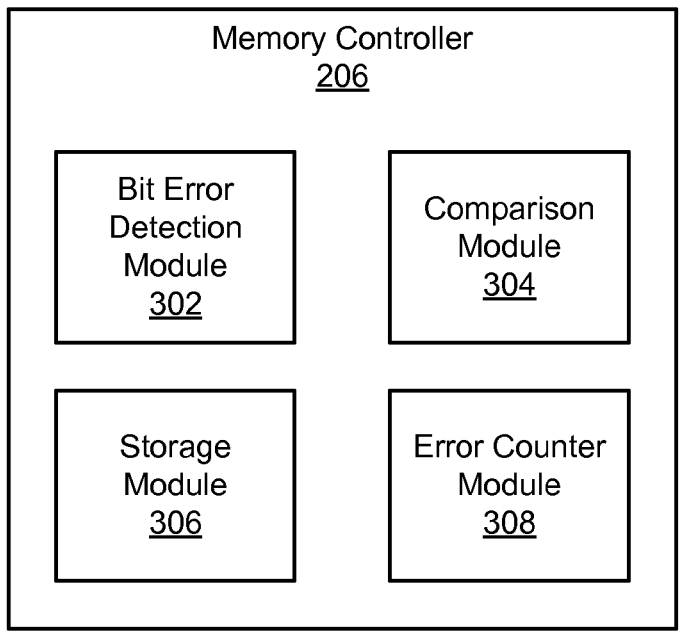
FIG. 3 is a schematic block diagram illustrating one embodiment of an apparatus for distinguishing correctable single bit errors in memory in accordance with the present invention.

FIG. 3 is a schematic block diagram illustrating one embodiment of an apparatus 300 for distinguishing correctable single bit errors in memory in accordance with the present invention. The apparatus 300 includes, in one embodiment, a memory controller 206 with a bit error detection module 302, a comparison module 304, a storage module 306, and an error counter module 308, which are described below. In another embodiment, the modules 302, 304, 306, 308 are included in other locations and forms within the computer 202.

The apparatus 300 detects a correctable bit error during a memory READ operation and then compares an error location indicator of the correctable bit error (error address) to one or more stored error location indicators corresponding to previously detected correctable bit errors. If the error location indicator does not match one of the stored error location indicators, the error location indicator is stored with the other stored error location indicators. If the error location indicator matches a stored error location indicator, an error counter is increased or incremented.

The apparatus 300 includes a bit error detection module 302 that detects a correctable bit error in a data memory 204 in response to a memory READ operation. The memory READ operation is generated during normal operation of a processor 208 in communication with the data memory 204. Normal operation of a processor 208 is hereby defined in this application as operation of a processor 208 to service client data requests, internal processes, program execution, and the like and is defined herein to not include dedicated memory checking operations such as a memory scrub. Typically, memory READ operations during normal operations access memory locations as needed to support typical data storage and retrieval, program code, execution, etc. and typically access memory locations where data is stored or is to be stored. Memory READ operations during normal operations, as defined herein, does not include sequential access of memory locations of a memory module 116, a memory region, memory segment, etc. to verify memory integrity, to scrub memory so that the memory contains all zeros or all ones, or to overwrite memory, during a later scheduled memory correction operation, with corrected data after the corrected data has been transmitted to a requesting device or client.

The correctable bit error is any bit error that is correctable using ECC. In one example, the error may be due to some transient condition that results in a single bit changing from a desired state to an undesired state. The error, in this example, may be caused by some temporary electrical fluctuation or other condition that changes a "0" stored in one bit location to a "1," or vice versa. The error may be at a memory cell 112, may be due to a bit line 114, or may be due to a temporarily malfunctioning memory module 116. In another embodiment, the error is due to some permanent condition, such as failure of a transistor, damage due to a static discharge, etc. For a typical error detection and correction scheme, a correctable bit error includes an error of a single bit in a memory segment or memory address. For other more complex error detection and correction schemes, two or more bits in error may be corrected and may be a termed correctable bit error.

The computer 202, through the memory controller 206 or other device, may also detect a non-correctable bit error. A non-correctable bit error may include more bit errors in a memory location, sequence, transmission, etc. that are not correctable using ECC. For example, for an error detection and correction scheme that can correct a single bit error, data having two or more errors would be non-correctable. A non-correctable bit error may also occur in a location beyond the hardware, software, etc., that can use ECC to correct the error, and may therefore be a non-correctable bit error. Non-correctable bit errors are typically handled through error messages, interrupts, etc., that are outside of the scope of the present invention.

Typically, the bit error detection module 302 is configured to employ an error detection and correction scheme to detect a correctable bit error. The bit error detection module 302 may use hardware, software, or a combination of hardware and software to detect the error. Typically, the bit error detection module 302 detects a correctable bit error in conjunction with an operation to access previously stored data. The previously stored data includes ECC stored with the data or in another location. One of skill in the art will recognize other ways that a bit error detection module 302 may detect correctable bit errors in data memory 204.

Typically, after the bit error detection module 302 or other hardware, module, etc., detects a correctable bit error, the correctable bit error is corrected. Usually, the ECC stored with the data with the error is used to correct the error. For example, if the processor 208 requests data from a location in the data memory 204 and the data contains a correctable bit error, the computer 202 corrects the error using the ECC prior to the data being sent to the processor 208.

The apparatus 300 includes a comparison module 304 that compares an error location indicator with a stored error location indicator. In one embodiment, the comparison module 304 is part of a memory controller 206. The error location indicator includes some indication of location of the correctable bit error. In one embodiment, for a memory cell error the error location indicator may be an address in the data memory 204 that contains the correctable bit error. For the example depicted in FIG. 1A, the error location indicator may be the memory address associated with row R2 that includes a single cell 112 in error. The error location indicator for a memory cell error may be a physical address or a virtual address mapped to the physical address.

In another embodiment, an error location indicator is an indicator of which bit of a memory location of a correctable bit error is in error. For example, a memory address associated with an accessed row (any of rows R1 to R10 in FIG. 1A) may be affected by a bit line error 114. If row R3 is accessed, the second bit from the right may be in error because bit line C2 114 is in error. The single-bit error may be correctable even though the entire C2 bit line 114 is in error. The error location indicator may correspond to the C2 bit line 114. line 114. The error location indicator may be a "2" to indicate that the second bit is in error.

In another embodiment, the error location indicator may be a memory module number of a memory module 116 that contains a correctable bit error. For example, if a single-bit correctable bit error occurs and the bit in error is determined to be in memory module 3 116C, the error location indicator may correspond to the memory module 116C in error. The memory location indicator may be a "3" to indicate that memory module 3 116C is the memory module 116 in error. In this case, even if an error does not repeatedly occur at a particular memory cell or on a particular bit line of memory module 3 116C, memory module 3 116C may be causing enough errors that it may be desirable to replace the memory module 116C. One of skill in the art will recognize other error location indicators and other ways to identify an error location indicator affected by a correctable bit error.

The stored error location indicator corresponds to at least one previously stored location indicator of a previously detected correctable bit error. The stored error location indicator, in one embodiment, is stored in a register. In another embodiment, the error location indicator is stored in a particular memory location. In yet another embodiment, the error location indicator is stored in a first-in first-out ("FIFO") register with two or more locations to store error location indicators. The stored error location indicator includes at least one error location indicator or a location to store an error location indicator. For example, if the bit error detection module 302 has not previously detected an error, like in the case of data memory 204 that is new, reset, etc., a location to store a stored error location indicator may not include an error location indicator associated with a previously detected correctable bit error.

In one embodiment, a location to store an error location indicator includes a single register or memory location to store an error location indicator. In this case, a previously stored error location indicator may be replaced by an error location indicator associated with a correctable bit error detected by the bit error detection module 302. Storing a single error location indicator is advantageous because only one register or memory location location is required to store the error location indicator. However, a single register or memory location would not allow more than one error location indicator to be stored at a time.

In another embodiment, the location to store an error location indicator includes capacity to store two or more error location indicators. For example, the location to store an error location indicator may be a FIFO. As the FIFO stores error location indicators, the FIFO will fill and eventually the FIFO may lose a stored error location indicator when a new error location indicator is stored. A specified number of memory locations may also be used to store error location indicators. A FIFO is advantageous because more than one error location indicator can be stored and an oldest stored error location indicator is easily removed when the FIFO is full and a new error location indicator is added. If multiple memory locations are used to store error location indicators, software may be used to keep track of the stored error location indicators and which error location indicator to remove when the allocated memory locations are full and a new error location indicator is stored. A software implementation may be desirable to not tie up hardware registers, but may require more overhead than a hardware implementation.

The comparison module 304 compares an error location indicator corresponding to a correctable error detected by the bit error detection module 302 with one or more stored error location indicators to determine if the error location indicator matches a stored location indicator. In a preferred embodiment, the comparison module 304 compares an error location indicator to all stored error location indicators. In another embodiment, the comparison module 304 compares an error location indicator to a single stored error location indicator, or to a subset of the total stored error location indicators. For example, if error location indicators are stored in memory locations, the comparison module 304 may compare only the twenty most recently stored error location indicators.

Typically, the comparison module 304 compares an error location indicator with stored error location indicators of like type. For example, the comparison module 304 may compare an error address with stored error addresses. In another example, the comparison module 304 compares a bit location with a stored bit location. In yet another example, the comparison module 304 compares a memory module number with stored memory module numbers. One of skill in the art will recognize other ways that the comparison module 304 may compare an error location indicator to one or more stored error location indicators.

The apparatus 300 includes a storage module 306 that stores the error location indicator in response to the comparison module 304 determining that the error location indicator differs from a stored error location indicator. In one embodiment, the storage module 306 stores the error location indicator over a stored error location indicator stored in a single register. In another embodiment, the storage module 306 stores the error location indicator in a FIFO. If the FIFO is full of stored error location indicators, the first to be stored error location indicator is pushed out of the FIFO. In another embodiment, the storage module 306 stores the error location indicator in a memory location. In yet another embodiment, the storage module 306 stores the error location indicator for a period of time. For example, a stored error location indicator may be cleared after a predetermined period of time. In another example, the stored error location indicator may be cleared after a predetermined number of correctable bit errors that do not correspond to the stored error location indicator. One of skill in the art will recognize other ways for the storage module 306 to store an error location indicator in response to the comparison module 304 determining that the error location indicator does not match a stored error location indicator.

The apparatus 300 includes an error counter module 308 that increases an error counter corresponding to the error location indicator in response to the comparison module 304 determining that the error location indicator matches a stored error location indicator. For example, if an error location indicator is an error address, the error counter module 308 may increase an error counter that corresponds to the error address if the comparison module 304 determines that the error address matches a stored error address.

In one embodiment, the apparatus 300 includes an error counter for a class of error location indicators, such as error addresses. If five error addresses are stored, the apparatus 300 may include one error counter and the error counter module 308 increases the error counter each time the comparison module 304 determines that an error address matches any of the five stored error addresses. In another embodiment, the apparatus 300 includes an error counter for each error location indicator. For example, an error counter may correspond to each stored error address. If five error addresses are stored, the apparatus 300 includes five error counters. The error counter module 308 would increase a specific error counter related to one of the five stored error addresses if the comparison module 304 determines that an error address matches the stored error address corresponding to error counter.

Beneficially, the apparatus 300 detects a correctable bit error in a data memory during normal operation of a processor and then compares an error location indicator corresponding to the correctable bit error with stored error location indicators. If there is a match, an error counter corresponding to a stored error location indicator is increased. If not, the error location indicator is stored. The apparatus 300 does not require any special operation to scan or scrub memory, but is able to operate on-the-fly. The apparatus 300 efficiently processes correctable bit errors and keeps track of permanent errors using counters.

Figure 4:
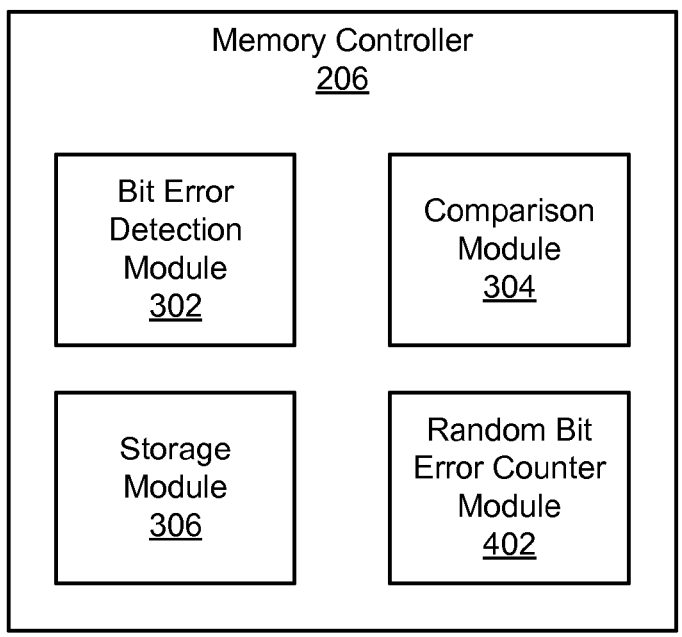
FIG. 4 is a schematic block diagram illustrating an alternate embodiment of an apparatus for distinguishing correctable single bit errors in memory in accordance with the present invention.

FIG. 4 is a schematic block diagram illustrating an alternate embodiment of an apparatus 400 for distinguishing correctable single bit errors in memory in accordance with the present invention. The apparatus 400 includes a bit error detection module 302, a comparison module 304, a storage module 306, and a random bit error detection module 402. The comparison module 304 and storage module 306 are substantially similar to those described above in relation to the apparatus 300 of FIG. 3.

The apparatus 400 includes a bit error detection module 302 that is substantially similar to the bit error detection module 302 described above in relation to the apparatus 300 of FIG. 3 except that the bit error detection module 302 of the apparatus 400 may detect correctable bit errors on-the-fly or during a dedicated memory checking operation, such as a memory scrub. The bit error detection module 302 detects a correctable bit error in a data memory 204 where the correctable bit error is correctable using ECC.

The apparatus 400 includes a random bit error counter module 402 that increases a random bit error counter in response to the comparison module 304 determining that the error address differs from a stored error address. The random bit error counter module 402 also does not increase the random bit error counter in response to the comparison module 304 determining that the error location indicator matches a stored error location indicator. The random bit error counter may be used by the computer 202 to determine, for example, if the data memory 204 is deteriorating, degrading, etc. Typically the random bit error counter module 402 increases the random bit error counter by one for each detected correctable bit error where an error location indicator does not match a stored error location indicator.

Beneficially, the apparatus 400 does not increase the random bit error counter when the apparatus 400 detects a correctable bit error at the same address of a previously detected correctable bit error. This type of error typically corresponds to a permanent error. A random bit error counter may be used to signal replacement of memory or other significant action and a single permanent error, or even a handful of permanent errors, may not warrant replacement of memory or similar action.

A permanent error may be acceptable under certain circumstances. For example, a single memory cell error may be correctable using single-bit correction. While a permanent error relies on ECC to correct the error and will reduce the fault tolerance of the data memory 204, at least for the memory address containing the permanent error, statistically there may be a only a remote possibility of another error within the error address so the data memory 204 may continue to operate with a permanent error. An increase in random errors, on the other hand, may signal a general degradation of the data memory 204 and may be deemed more serious than one or a handful of permanent errors. Other means in the the computer 202 may also be used to deal with a single permanent error, such as avoiding use of the memory location with the permanent error. The apparatus 400 is thus able to distinguish between temporary and permanent correctable bit errors and may extend the useful life of data memory 204.

Figure 5:
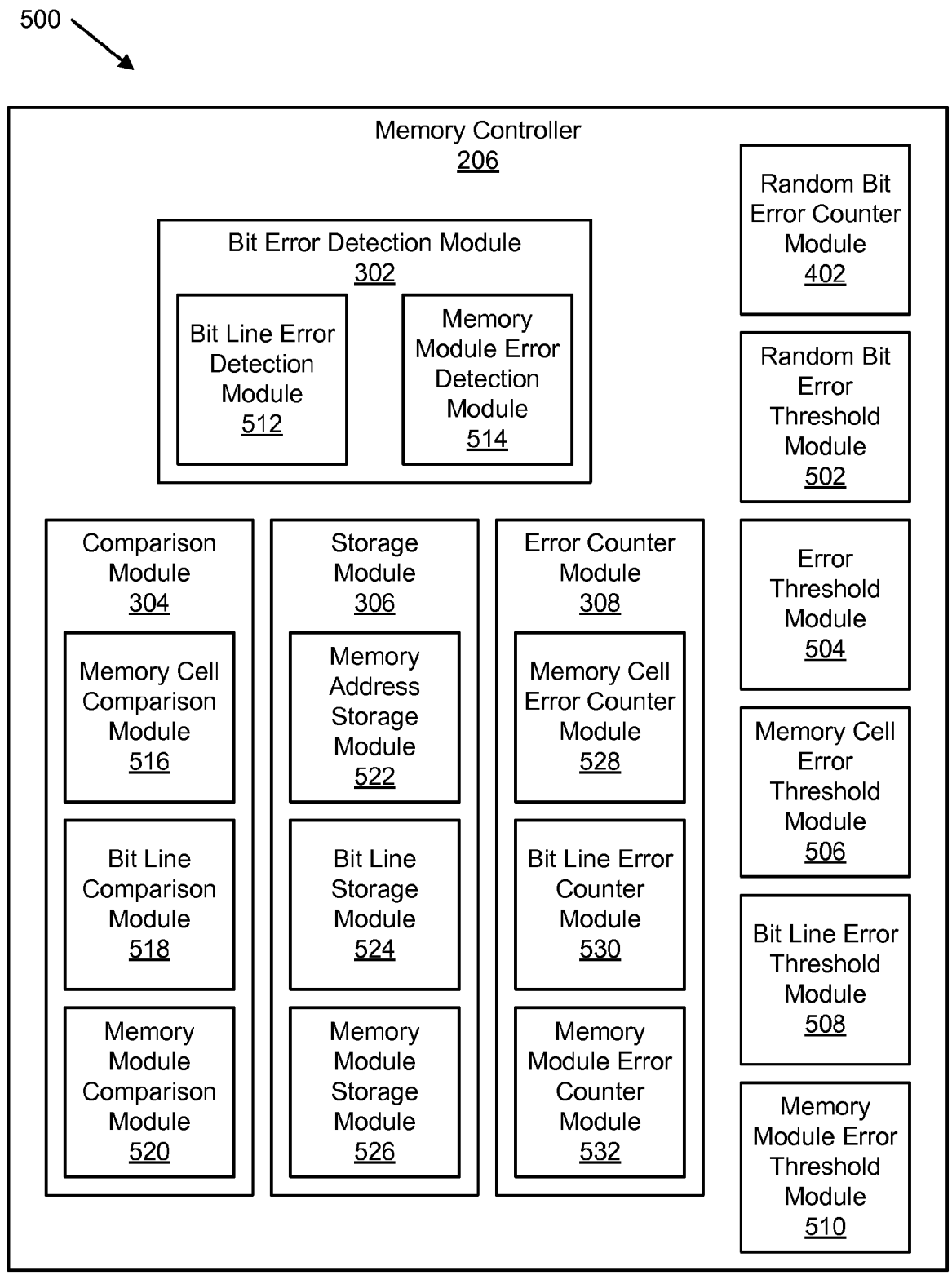
FIG. 5 is a schematic block diagram illustrating another embodiment of an apparatus for distinguishing correctable single bit errors in memory in accordance with the present invention.

FIG. 5 is a schematic block diagram illustrating another embodiment of an apparatus 500 for distinguishing correctable single bit errors in memory in accordance with the present invention. The apparatus 500 includes a bit error detection module 302, a comparison module 304, a storage module 306, an error counter module 308, and a random bit error counter module 402, which are substantially similar to those described above in relation to the apparatus 300 in FIG. 3 and the apparatus 400 in FIG. 4.

The apparatus 500 may also include a random bit error threshold module 502, an error threshold module 504, a memory cell error threshold module 506, a bit line error threshold module 508, and a memory module error threshold module 510, which are described below. The bit error detection module 302 may include a bit line error detection module 512 and a memory module error detection module 514, the comparison module 304 may include a memory cell comparison module 516, a bit line comparison module 518, and a memory module comparison module 520, the storage module 306 may include a memory address storage module 522, a bit line storage module 524, and a memory module storage module 526, and the error counter module 308 may include a memory cell error counter module 528, a bit line error counter module 530, and a memory module error counter module 532, which are described below. In one embodiment, one or more of the modules 302, 304, 306, 308, 402, 502, 504, 506, 508, 510, 512, 514, 516, 518, 520, 522, 524, 526, 528, 530, 532 are included in a memory controller 206, but all or part may be included elsewhere in the computer 202.

The apparatus 500, in one embodiment, includes a random bit error threshold module 502 that generates an error in response to the random bit error counter reaching a bit error threshold. The random bit error threshold module 502 may respond to the random bit error counter reaching one or more bit error thresholds. For example, the random bit error threshold module 502 may generate an error at a lower bit error threshold to warn of data memory 204 degradation. In another example, the random bit error threshold module 502 may generate a bit error in response to a higher bit error threshold to take corrective action, such as shutting down the computer 202, disabling the data memory 204 or a memory module 116, or the like.

The random bit error threshold module 502 may generate an error in response to one or more random bit error counters. For example, the computer 202 may include multiple memory modules or may include a data memory 204 and a cache, each with an associated random bit error counter. One of skill in the art will recognize other ways that the random bit error threshold module 502 may generate an error in response to a random bit error counter reaching or surpassing a random bit error threshold.

The apparatus 500, in another embodiment, includes an error threshold module 504 that generates an error in response to the error counter reaching an error threshold. The apparatus 500 may include one or more error thresholds. When the error counter reaches an error threshold, the error threshold module 504 generates an error that may take many forms, such as generating a message, stopping write operations, disabling a memory module 116, etc.

Typically the error threshold and error counter relate to a particular class of error location indicators, such as error addresses, error bit locations, memory module numbers, etc. Typically a random bit error threshold and an error threshold are set relative to each other based on factors such as use and type of the data memory 204, likelihood of repeat errors, reliability, error location indicator class, and the like. One of skill in the art will recognize other factors and considerations in setting random bit error thresholds and error thresholds.

When an error location indicator is an error address, the apparatus 500, in a particular embodiment, may include a memory cell comparison module 516, a memory address storage module 522, a memory cell error counter module 528, and possibly a memory cell error threshold module 506. In this embodiment, an error location indicator comprises an error address and a stored error location indicator comprises a stored error address. The error location indicator may comprise other classes of errors as well as will be described below.

In the embodiment, the apparatus 500 includes a memory cell comparison module 516 compares an error address corresponding to a correctable bit error to one or more stored error addresses. The stored error addresses are error addresses corresponding to previous correctable bit errors. In one embodiment, the memory cell comparison module 516 is part of the comparison module 304. In another embodiment, the memory cell comparison module 516 is separate from the comparison module 304 and may cooperate with the comparison module 304.

In the embodiment, the apparatus 500 also includes a memory address storage module 522 that stores the error address if the memory cell comparison module 516 determines that the error address does not match any stored error addresses. The stored error addresses may be stored in one or more registers, a FIFO, a memory location, etc. Typically, the memory address storage module 522 stores an error address when a correctable bit error occurs a first time at the error address or if the error address was previously stored but subsequently cleared. The memory address storage module 522 may be part of the storage module 306 or may be part of the memory controller 206 and may cooperate with the storage module 306.

The apparatus 500, in the embodiment, includes a memory cell error counter module 528 that increases a memory cell error counter if the memory comparison module 516 determines that the error address matches a stored error address. The memory cell error counter may be used to track correctable errors occurring at a memory location. For instance, a detected correctable bit error occurring at an error address may be stored for an initial correctable bit error by the memory address storage module 522 and, if a random bit error counter module 402 is included, the random bit error counter module 402 may increase a random bit error counter.

A second correctable bit error at the same location may then be detected by the bit error detection module 302 and the memory cell error counter module 528 increases the memory cell error counter. Subsequent correctable bit error at the same location may be detected and the memory cell error counter module 528 may then increase the memory cell error counter for each detected error. Beneficially, the memory cell error counter may be used to take corrective action related to a location associated with the correctable errors at the location corresponding to the memory cell error counter.

In another embodiment, the memory cell error counter module 528 may correspond to two or more stored error addresses and may increase the memory cell error counter when a correctable bit error is detected at any of the corresponding error addresses. For example, the memory cell error counter module 528 may increase the memory cell error counter when the memory cell comparison module 516 determines that an error address matches any of the stored error addresses in a FIFO register, group of registers, or memory locations storing error addresses. The memory cell error counter module 528 may increase one memory cell error counter or more than one memory cell error counter. One of skill in the art will recognize other ways that a memory cell error counter module 528 may increase a memory cell error counter in response to the memory cell comparison module 516 detecting a match between an error address and a stored error address.

In the embodiment, the apparatus 500 may include a memory cell error threshold module 506 that generates an error in response to the memory cell error counter reaching a memory cell error threshold. For example, a user, an application, etc. may set one or more memory cell error thresholds. A memory cell error threshold, in one instance, may be set to a value that corresponds to a reasonable expectation that the error address contains a permanent error. The error may then be used to take corrective action, such as sending an error message, signaling that the error address not be used for future data storage, replacing the the data memory 204, etc.

The memory cell error threshold module 506 may generate an error, in one embodiment, when the memory cell error counter matches the memory cell error threshold. In another embodiment, the memory cell error threshold module 506 generates an error when the memory cell error counter exceeds the memory cell error threshold. The memory cell error threshold module 506 may generate an error for one or more memory cell error counters and may respond differently to different memory cell error thresholds. One of skill in the art will recognize other ways for the memory cell error threshold module 506 to generate an error in response to a memory cell error counter and a memory cell error threshold.

In an alternate embodiment of the invention, the apparatus 500 includes a bit line error detection module 512, a bit line comparison module 518, a bit line storage module 524, and a bit line error counter module 530. The bit line error detection module 512 may be included with the bit error detection module 302, the comparison module 304 may include the bit line comparison module 518, the storage module 306 may include the bit line storage module 524, and the error counter module 308 may include the bit line error counter module 530. In another embodiment, the bit line modules 512, 518, 524, 530 are separate, but may cooperate with the bit error detection module 302, comparison module 304, storage module 306, and error counter module 308.

In the embodiment, an error location indicator comprises an error bit location and the stored error location indicator comprises a stored error bit location. Other error location indicators of other classes may also be included with the embodiment and processed separately. In the embodiment the apparatus 500 includes a bit line error detection module 512 that detects a bit location of the correctable bit error relative to bits in the memory accessed as a memory address. In the embodiment, the bit line error detection module 512 includes a sensing capability to sense which bit of bits stored together in a memory location are in error. For the example depicted in FIG. 1A, the bit line error detection module 512 may detect that the bit corresponding to column C2 114 is in error in addition to the bit error detection module 302 detecting a correctable bit error.

The bit line comparison module 518 compares the bit location with any stored bit locations and determines if the bit location matches a stored bit location. A stored bit location corresponds to at least one previously stored bit location of a previous correctable bit error relative to bits in the data memory 204 accessed as a memory address. For example, the bit line error detection module 512 may have previously detected which bit of a correctable bit error detected by the bit error detection module 302 was in error. In a previously detected correctable bit error, as depicted in FIG. 1A, the second bit (C2 114) of a row 106 may have been detected by the bit line error detection module 512 and this information may have been stored as a stored bit location by the bit line storage module 524. The bit line comparison module 518 may then compare a newly detected bit location with the stored bit location C2 114 to determine if the bit line error is a match.

In another embodiment, the bit line comparison module 518 also determines if a bit previously in error is no longer in error. For example, if the second bit (C2 114) of a row was previously determined to be in error and was a "1" when it should have been a "0," the second bit (C2 114) may be stuck at a "1." In the embodiment, the bit line comparison module 518 may determine that the bit line is a "0" when it should be a "0" and is no longer in error.

The bit line storage module 524 stores the bit location in response to the bit line comparison module 518 determining that the bit location differs from a stored bit location. In one example, if a register, memory, location, etc. where a bit location is stored is empty, contains a default value, etc., the bit line comparison module 518 would then determine that the detected bit location does not match a stored bit location and the bit line storage module 524 then stores the bit location. Referring again to the example depicted in FIG. 1A, if no correctable error was previously detected, a bit location storage location was cleared, etc. the bit line storage module 524 may then store a "2" or some other indication that the second bit is that the second bit is in error either from a bit line error 114 or a single cell error 112.

In another example, if the bit line comparison module 518 determines that a bit location of a previously detected correctable error (for example bit three (C3 115) of FIG. 1A) does not match a bit location of a newly detected correctable bit error (for example bit two (C2 114) of FIG. 1A corresponding to either a single cell error 112 or a bit line error 114), the bit line storage module 524 stores the bit location.

In one embodiment, the bit line storage module 524 stores the bit location over a previously stored bit location. In another embodiment, the bit line storage module 524 stores the bit location in a register (such as a FIFO register) or memory with multiple allocated storage locations so more than one bit location may be tracked. The bit line storage module 524 may, in one embodiment, clear a stored bit location after a bit location of a predetermined number of correctable bit errors have been detected and do not match the stored bit location.

For example, if the third bit is determined to be in error and the third bit is stored as the bit location, then if another correctable bit error is detected and the bit line error detection module 512 determines that the second bit is in error as the bit location, the bit line storage module 524 may clear the stored bit location corresponding to the third bit. Clearing the stored bit location may also be useful where multiple bit locations are stored. For example, a particular stored bit location may be cleared if a predetermined number of correctable bit errors are detected and none includes an error of the stored bit location.

In another embodiment, the bit line storage module 524 may clear a stored bit location if the bit line comparison module 518 determines that a bit line is no longer in error. For example, if the second bit (C2 114) of a row 106 may have been previously detected to be a "1" when it should have been a "0," and then later the second bit (C2 114) is determined to a "0" when it should be a "0," the bit line storage module 524 may clear or overwrite a register or memory location that indicated that the second bit (C2 114) was incorrect.

The bit line error counter module 530 increases a bit line error counter in response to the bit line comparison module 518 determining that the bit location matches a stored bit location. For the example depicted in FIG. 1A, if a stored bit location corresponds to an error of the second bit (C2 114) and the bit line error detection module 512 detects in a correctable bit error that the second bit (C2 114) is the bit location in error, the bit line comparison module 518 determines that the bit location matches the stored bit location and the bit line error counter module 530 increases a bit line error counter.

The stored bit location, indicating that the second bit (C2 114) is in error, may correspond to a correctable bit error that occurred in, for example, row R4. A detected bit location, which also indicates that the second bit (C2 114) is in error, may correspond to a correctable bit error in row R2. In this case, the likelihood that there is a bit line error is increased so the bit line error counter module 530 increases the bit line error counter. The bit line error detection module 512 may detect in subsequent correctable bit errors where the bit location of the errors is also in the second bit (C2 114) and the bit line error counter module 530 continues to increase the bit line error counter. As the counter increases, there is a stronger likelihood that a bit line is in error.

In one embodiment, the bit line error counter module 530 prevents the random bit error counter module 502 from increasing the random bit error counter when the bit line comparison module 518 determines that the bit location matches the stored bit location. In this case, for matching bit locations, the bit line error counter is increased while the random bit error counter remains the same. In another embodiment, the bit line error counter module 530 allows the random bit error counter module 502 to increase the random bit error counter (or the bit line error counter module 530 increases the random bit error counter) when the bit line comparison module 518 determines that the bit location matches the stored bit location.

In one embodiment, the apparatus 500 includes a bit line error threshold module 508 that generates an error when the bit line error counter reaches a bit line error threshold. Typically the bit line error threshold is set to a value likely to correspond to a reasonable assurance that a bit line is in error 114. In one embodiment, the bit line error threshold module 508 generates an error when the bit line error counter reaches the bit line error threshold. In another embodiment, the bit line error threshold module 508 generates an error when the bit line error counter exceeds the bit line error threshold. One of skill in the art will recognize appropriate values for a bit line error threshold and other ways for the bit line error threshold module 508 to generate an error.

In certain embodiments, the bit line error threshold module 508 may generate an error to shut down data memory 204 with common bit lines being detected, to notify a user or system administrator, bypass a memory module, etc. In one embodiment, the apparatus 500 may detect bit line errors for multiple memory module or different types of memory. For example, if a bit line serves a memory module and a computer 202 includes more than one module, the apparatus 500 may separately detect and count bit line errors.

In one embodiment, multiple bit line error thresholds are set with different actions occurring for each threshold. Typically, a bit line error threshold may be set relative to other thresholds based on a projected number of errors, a perceived number of errors required to ensure a bit line is in error, usage and criticality of the data memory 204, etc. One of skill in the art will recognize other embodiments of the apparatus 500 that detect and count bit line errors in addition to distinguishing permanent and temporary correctable bit errors.

In an alternate embodiment of the invention, the apparatus 500 includes a memory module error detection module 514, a memory module comparison module 520, a memory module storage module 526, and a memory module error counter module 532. The memory module error detection module 514 may be included with the bit error detection module 302, the comparison module 304 may include the memory module comparison module 520, the storage module 306 may include the memory module storage module 526, and the error counter module 308 may include the memory module error counter module 532. In another embodiment, the memory module modules 514, 520, 526, 532 are separate, but may cooperate with the bit error detection module 302, comparison module 304, storage module 306, and error counter module 308.

In the embodiment, an error location indicator comprises a memory module number and the stored error location indicator comprises a stored memory module number. Other error location indicators of other classes may also be included with the embodiment and processed separately. In the embodiment the apparatus 500 includes a memory module error detection module 514 that detects which memory module includes the correctable bit error where the memory module is one of a group of memory modules operating together as an addressable memory location in the data memory 204.

In the embodiment, the memory module error detection module 514 includes a sensing capability to sense which module includes the correctable bit error. For the example depicted in FIG. 1B, the memory module error detection module 514 may detect a correctable bit error is in memory module 2 116B so the corresponding memory module number detected by the memory module error detection module 514 may be "2." Of course one of skill in the art will recognize other representations of the memory module number suitable for the memory module error detection module 514 to detect or return.

The memory module comparison module 520 compares the memory module number with any stored memory module number and determines if the memory module number detected by the memory module error detection module 514 matches a stored memory module number. A stored memory module number corresponds to at least one previously stored memory module number of a previous correctable bit error relative to memory modules operating as an addressable memory location in the data memory 204. For example, a stored memory module number may be a "2." If the memory module error detection module 514 returns a "2," the memory module comparison module 520 would determine that the memory module number "2" matches the stored memory module number "2."

In another embodiment, the memory module comparison module 520 also determines if a memory module 116 previously in error is no longer in error. For example, if the second memory module 116B was previously determined to be in error and the memory module error detection module 514 determines that the memory module 116 in error for another correctable bit error is not the second memory module 116B, the memory module comparison module 520 may clear a "2" as a stored memory module number. One of skill in the art will recognize other ways to clear a memory module number when a memory module 116 is no longer found to be in error.

The memory module storage module 526 stores the memory module number in response to the memory module comparison module 520 determining that the memory module number differs from a stored memory module number. In one example, if a register, memory, location, etc. where a memory module number is stored is empty, contains a default value, etc., the memory module comparison module 520 would then determine that the detected memory module number does not match a stored memory module number and the memory module storage module 526 then stores the memory module number.

Referring again to the example depicted in FIG. 1B, if no correctable error was previously detected, a memory module number storage location was cleared, etc. and if the memory module error detection module 514 determines the second memory module 116B includes the correctable bit error, the memory module storage module 526 may then store a "2" or some other indication that the second memory module 116B is in error. An error may be a bit line error 114, a single cell error 112, or some other error that causes error to continue to occur within a memory module 116. One of skill in the art will recognize other errors that may be detected by the memory module error detection module 514 that may form the basis for a memory module 116 error.

In another example, if the memory module comparison module 520 determines that a memory module number of a previously detected correctable error (for example memory module 3 116C of FIG. 1B) does not match a memory module number of a newly detected a newly detected correctable bit error (for example the memory module number may be a "2" for the second memory module 116B in error), the memory module storage module 526 stores the memory module number (in this case a "2" may be stored).

In one embodiment, the memory module storage module 526 stores the memory module number over a previously stored memory module number. In another embodiment, the memory module storage module 526 stores the memory module number in a register (such as a FIFO register) or memory with multiple allocated storage locations so more than one memory module number may be tracked. The memory module storage module 526 may, in one embodiment, clear a stored memory module number after a memory module number of a predetermined number of correctable bit errors have been detected and do not match the stored memory module number.

For example, if the third memory module 116C is determined to be in error and a "3" is stored, then if another correctable bit error is detected and the memory module error detection module 514 determines that the second memory module 116B is in error, the memory module storage module 526 may clear the stored memory module number corresponding to the third memory module 116C. Clearing the stored memory module number may also be useful where multiple memory module numbers are stored. For example, a particular stored memory module number may be cleared if a predetermined number of correctable bit errors are detected and none includes an error of the stored memory module number. In another embodiment, the memory module storage module 526 may clear a stored memory module number if the memory module comparison module 520 determines that a memory module 116 is no longer in error.

The memory module error counter module 532 increases a memory module error counter in response to the memory module comparison module 520 determining that the memory module number matches a stored memory module number. For the example depicted in FIG. 1B, if a stored memory module number corresponds to an error of the second memory module 116B and the memory module error detection module 514 detects in a a correctable bit error that the second memory module 116B is the memory module 116 in error, the memory module comparison module 520 determines that the memory module number matches the stored memory module number and the memory module error counter module 532 increases a memory module error counter.

For example, the memory module error detection module 514 may detect that a correctable bit error occurs in the second memory module 116B while the bit line error detection module 512 determines that the second bit (C2 114) is in error. The bit error detection module 302 may also determine that the correctable bit error occurred in a memory cell corresponding to row R4. The memory module storage module 526 would store a memory module number of "2."

Another correctable bit error may then occur and the memory module error detection module 514 may again detect that a correctable bit error occurred in the second memory module 116B. The bit line error detection module 512 may determine that the bit location of the error corresponds to the third bit (C3 115) and the bit error detection module 302 may determine that the correctable bit error occurred in a memory cell corresponding to row R2. In this example, the memory module comparison module 520 will detect a match and the memory module error counter module 532 will increase while the bit line error counter and the memory cell error counter are not increased. If errors continue to occur in the second memory module 116B, there is a higher likelihood that the second memory module 116B is failing.

In one embodiment, the memory module error counter module 532 prevents the random bit error counter module 502 from increasing the random bit error counter when the memory module comparison module 520 determines that the memory module number matches the stored memory module number. In this case, for matching memory module numbers, the memory module error counter is increased while the random bit error counter remains the same. In another embodiment, the memory module error counter module 532 allows the random bit error counter module 502 to increase the random bit error counter (or the memory module error counter module 532 increases the random bit error counter) when the memory module comparison module 520 determines that the memory module number matches the stored memory module number.

In one embodiment, the apparatus 500 includes a memory module error threshold module 510 that generates an error when the memory module error counter reaches a memory module error threshold. Typically the memory module error threshold is set to a value likely to correspond to a reasonable assurance that a memory module 116 is in error. In one embodiment, the memory module error threshold module 510 generates an error when the memory module error counter reaches the memory module error threshold. In another embodiment, the memory module error threshold module 510 generates an error when the memory module error counter exceeds the memory module error threshold. One of skill in the art will recognize appropriate values for a memory module error threshold and other ways for the memory module error threshold module 510 to generate an error.

In certain embodiments, the memory module error threshold module 510 may generate an error to shut down a memory module 116 in a data memory 204 and activate a spare memory module 120, to notify a user or system administrator, redirect memory access requests, etc. In one embodiment, the apparatus 500 may detect memory module 116 errors for multiple memory modules 116 operating as addressable memory locations or different types of data memory 204. For example, a group of memory modules 116 may serve as cache memory for a computer 202 while another group of memory modules 116 may serve as a buffer memory. The apparatus 500 may separately detect and count memory module 116 errors for the cache and buffer memory.

In one embodiment, multiple memory module error thresholds are set with different actions occurring for each threshold. Typically, a memory module error threshold may be set relative to other thresholds based on a projected number of errors, a perceived number of errors required to ensure a memory module 116 is in error, usage and criticality of the data memory 204, etc. One of skill in the art will recognize other embodiments of the apparatus 500 that detect and count memory module errors in addition to distinguishing permanent and temporary correctable bit errors.

Figure 6:
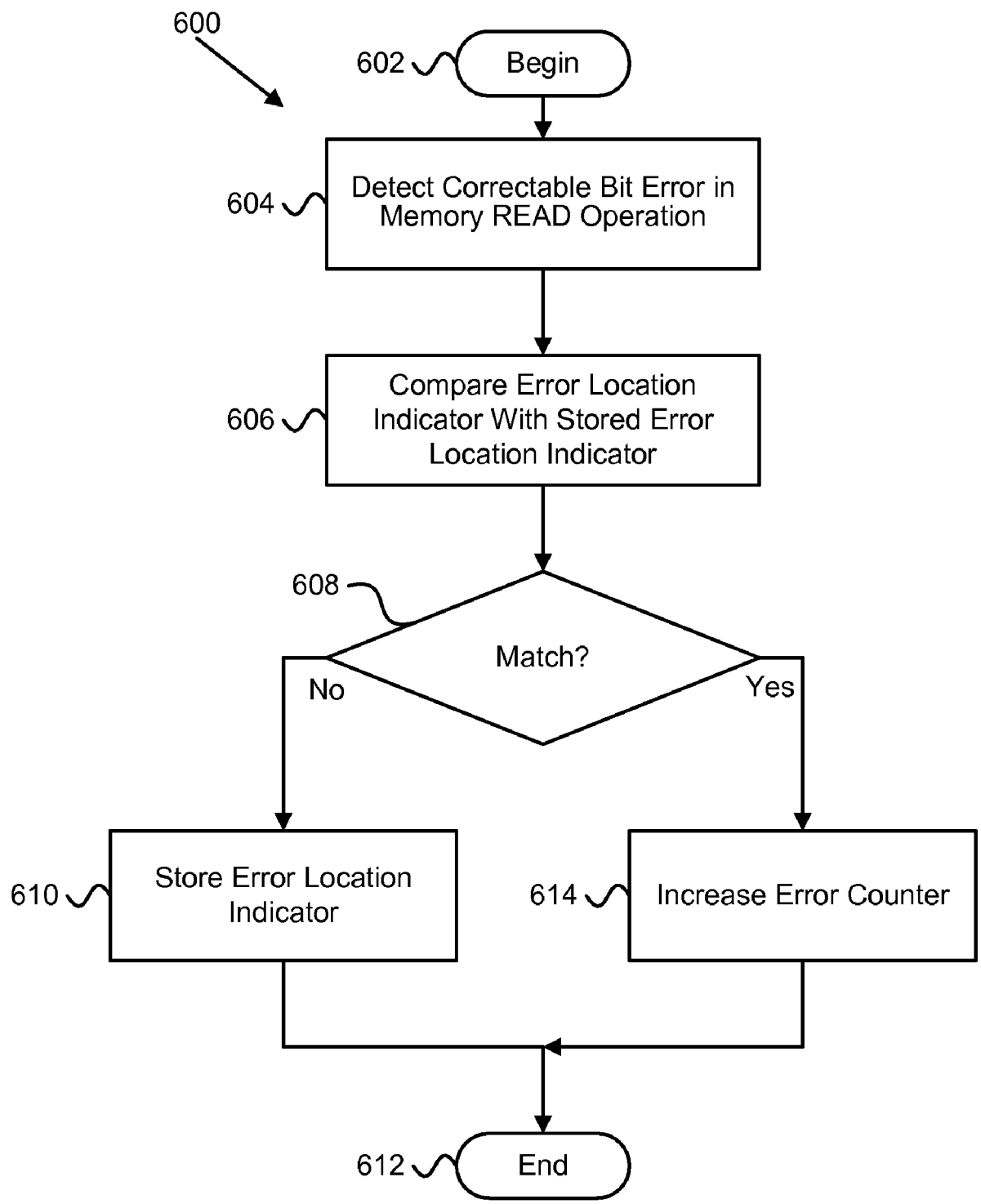
FIG. 6 is a schematic flow chart diagram illustrating one embodiment of a method for distinguishing correctable single bit errors in memory in accordance with the present invention.

FIG. 6 is a schematic flow chart diagram illustrating one embodiment of a method 600 for distinguishing correctable single bit errors in memory in accordance with the present invention. The method 600 begins 602 and the bit error detection module 302 detects 604 a correctable bit error in a data memory 204 in response to a memory READ operation. The memory READ operation is generated during normal on-the-fly operation of the processor 208. The correctable bit error is correctable using ECC. The comparison module 304 compares 606 an error location indicator with a stored error location indicator. The error location indicator is an indication of location in the data memory 204 of the correctable bit error. The stored error location indicator corresponds to at least one previously stored error location indicator of a previously detected correctable bit error.

The comparison module 304 determines 608 if the error location indicator matches a stored error location indicator. If the comparison module 304 determines 608 that the error location indicator does not match a stored error location indicator, the storage module 306 stores 610 the error location indicator and the method 600 ends 612. If the comparison module 304 determines 608 that the error location indicator matches a stored error location indicator, the error counter module 308 increases 614 an error counter the method 600 ends 612. The error counter corresponds to the error location indicator.

Figure 7:
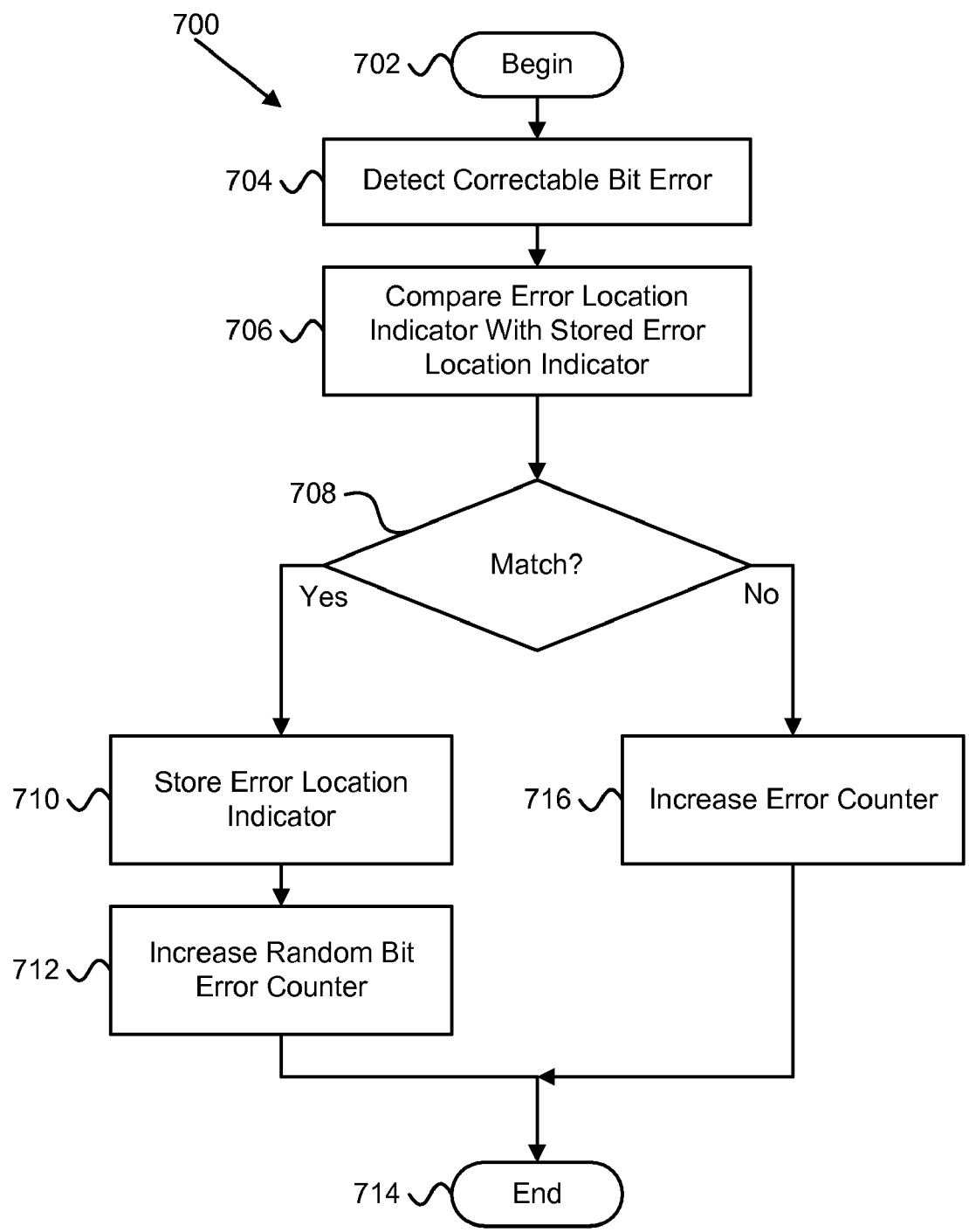
FIG. 7 is a schematic flow chart diagram illustrating an alternate embodiment of a method for distinguishing correctable single bit errors in memory in accordance with the present invention.

FIG. 7 is a schematic flow chart diagram illustrating an alternate embodiment of a method 700 for distinguishing correctable single bit errors in memory in accordance with the present invention. The method 700 begins 702 and the bit error detection module 302 detects 704 a correctable bit error. In this embodiment, the bit error detection module 302 may detect 704 a correctable bit error on-the-fly during normal operation or during a dedicated memory checking operation.

The comparison module 304 compares 706 an error location indicator with a stored error location indicator and determines 708 if the error location indicator matches a stored error location indicator. The error location indicator is an indication of location of the correctable bit error. The stored error location indicator corresponds to at least one previously stored error location indicator of a previously detected correctable bit error. If the comparison module 304 determines 708 that the error location indicator matches the stored error location indicator, the storage module 306 stores 710 the error location indicator and the random bit error counter module 402 increases 712 the random bit error counter and the method 700 ends 714. If the comparison module 304 determines 708 that the error location indicator does not match a stored error location indicator, the error counter module 308 increases 716 the error counter and the method 700 ends.

FIG. 8, which is divided into FIGS. 8A, 8B, 8C, and 8D is a schematic flow chart diagram illustrating another embodiment of a method 800 for distinguishing correctable single bit errors in memory in accordance with the present invention. The method 800 depicts an error location indicator being an error address, an error bit location, and a memory module number. One of skill in the art will recognize that the embodiment may be practiced without one or more of the error address indicators and accompanying steps. In addition, one of skill in the art will recognize that the portions of the flow chart depicted on pages 8A, 8B, and 8C may execute simultaneously once the error detection module 302 detects a correctable bit error.

The method 800 begins 802 and the bit error detection module 302 detects 804 a correctable bit error in a data memory 204. In one embodiment, the bit error detection module 302 detects a correctable bit error in response to a memory READ operation generated during on-the-fly, normal operation of a processor 208. In another embodiment, the bit error detection module 302 detects a correctable bit error either during normal operation or during a dedicated memory error detection operation that checks a section of data memory 204.

The memory cell comparison module 516 compares 806 an error address containing the correctable bit error with a stored error address and determines 808 if there is a match. If the memory cell comparison module 516 determines 808 that the error address associated with the detected correctable bit error matches a stored error address, the memory cell error counter module 528 increases 810 a memory cell error counter. The memory cell error counter typically tracks correctable bit errors occurring at an error address. The memory cell error counter module 528 may increase 810 a memory cell error counter corresponding to a stored error address, corresponding to a group of error addresses, corresponding to all stored error addresses, etc. One of skill in the art will recognize other configurations of a memory cell error counter module 528 and memory cell error counters.

The memory cell error threshold module 506 determines 812 if the memory cell error counter has reached a memory cell error threshold. If the memory cell error threshold module 506 determines 822 that the memory cell error counter has reached a memory cell error threshold, the memory cell error threshold module 506 generates 814 an error and the bit line error detection module 512 detects 816 an error bit location in the correctable bit error (follow "A" on FIG. 8A to "A" on FIG. 8B). If the memory cell error threshold module 506 determines 812 that the memory cell error counter has not reached a memory cell error threshold, the bit line error detection module 512 detects 816 an error bit location in the correctable bit error (follow "A" on FIG. 8A to "A" on FIG. 8B). The error generated 818 by the memory cell error threshold module 506 may signal that a correctable bit error is a permanent error, may indicate the associated error address, may prevent data from being written the error address, etc.

Figure 8A:
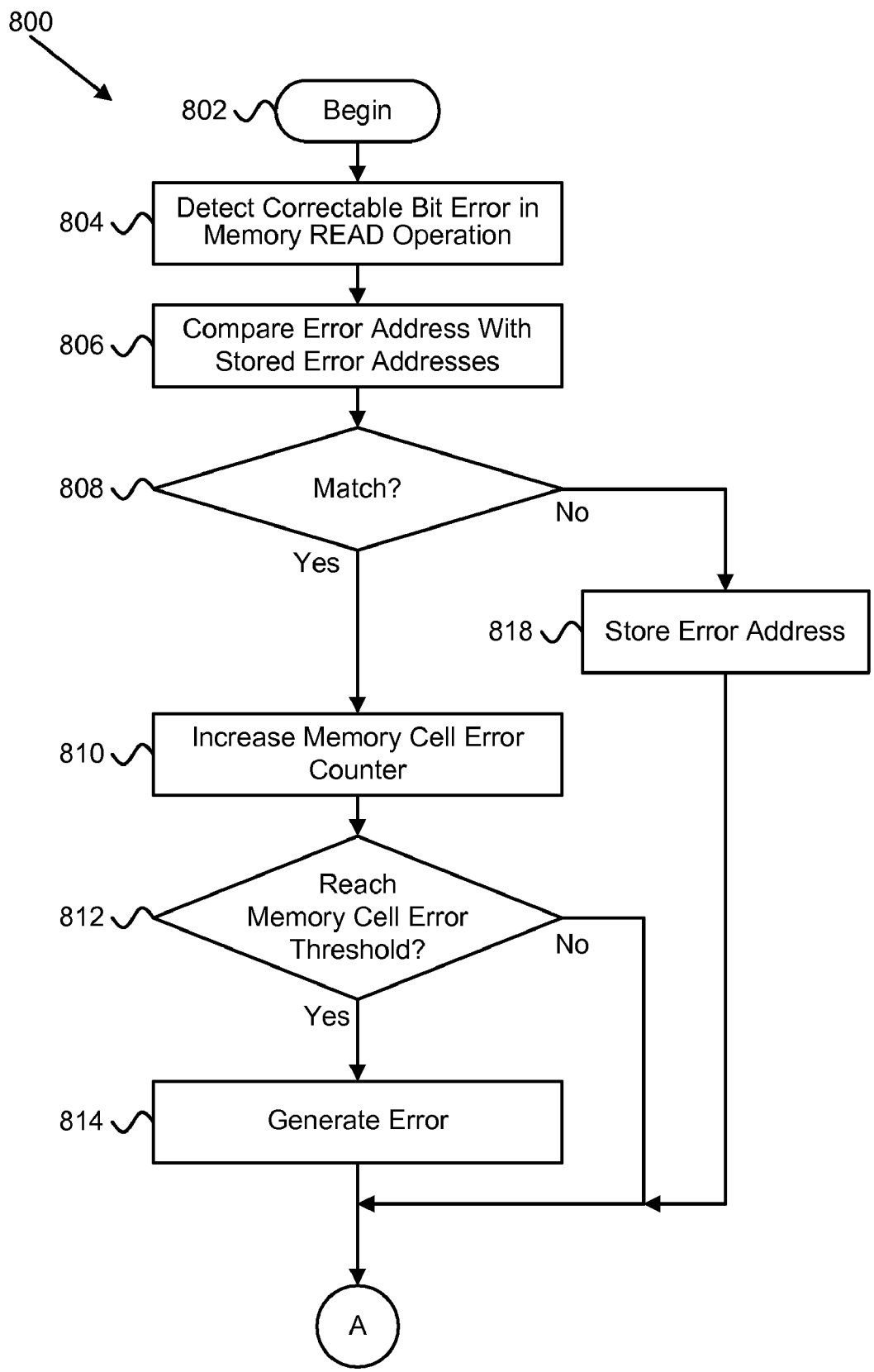
FIG. 8A is a first part of a schematic flow chart diagram illustrating another embodiment of a method for distinguishing correctable single bit errors in memory in accordance with the present invention.
Figure 8B:
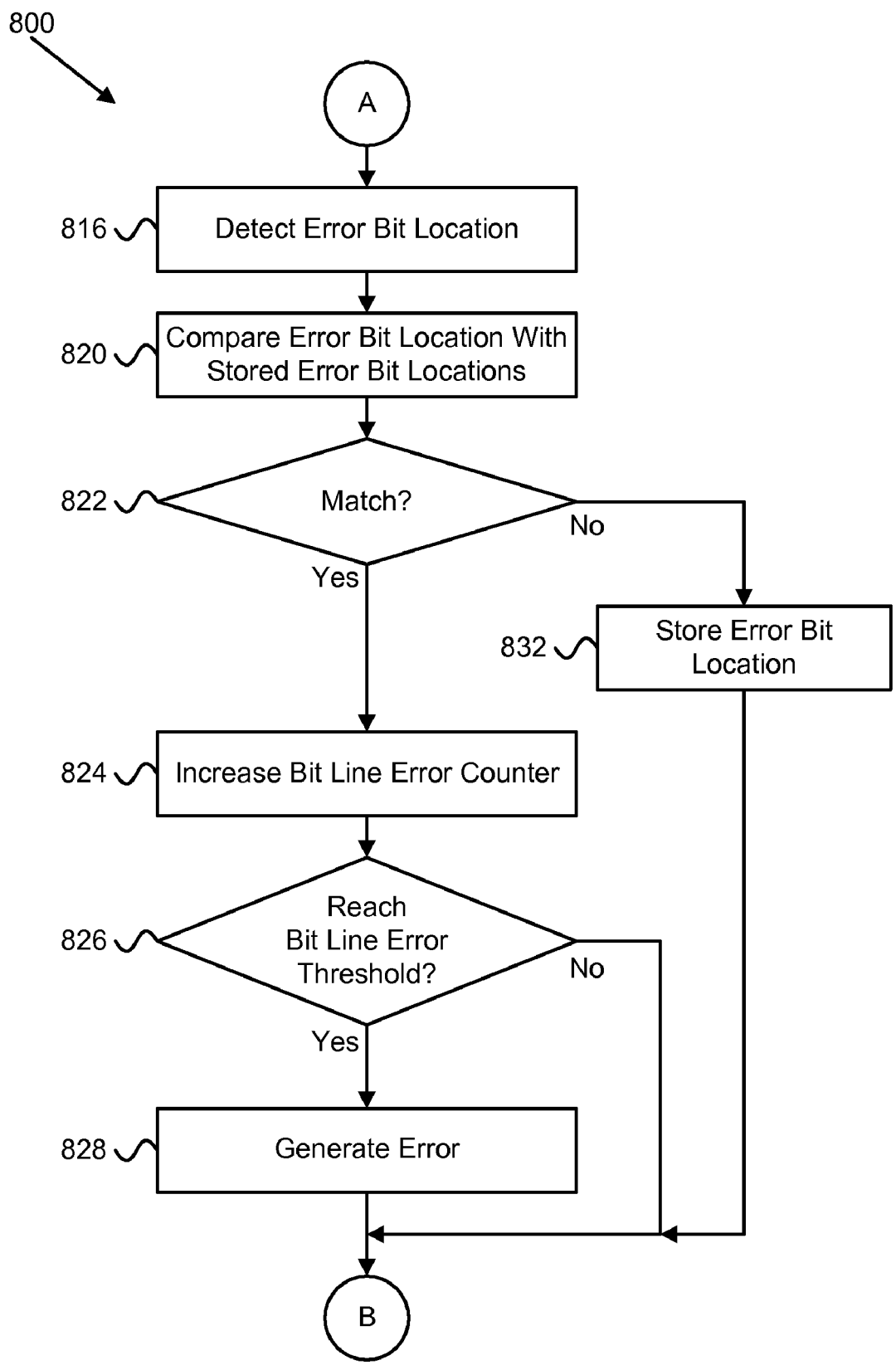
FIG. 8B is a second part of a schematic flow chart diagram illustrating another embodiment of a method for distinguishing correctable single bit errors in memory in accordance with the present invention.

If the memory cell comparison module 516 determines 808 that the error address associated with the detected correctable bit error does not match a stored error address, the memory address storage module 522 stores 818 the error address and the bit line error detection module 512 detects 816 an error bit location in the correctable bit error (follow "A" on FIG. 8A to "A" on FIG. 8B). The memory address storage module 522 stores 818 stores 818 the error address in a register, such as a single register, a group of registers, a FIFO register, etc., in a memory location, or in another suitable location.

The bit line comparison module 518 compares 820 the bit location with one or more stored bit locations and determines 822 if the bit location of the correctable error matches a stored bit location. If the bit line comparison module 518 determines 822 that the bit location of the correctable error matches a stored bit location, the bit line error counter module 530 increases 824 a bit line error counter. The bit line error threshold module 508 determines 826 if the bit line error counter has reached a bit line error threshold.

Figure 8C:
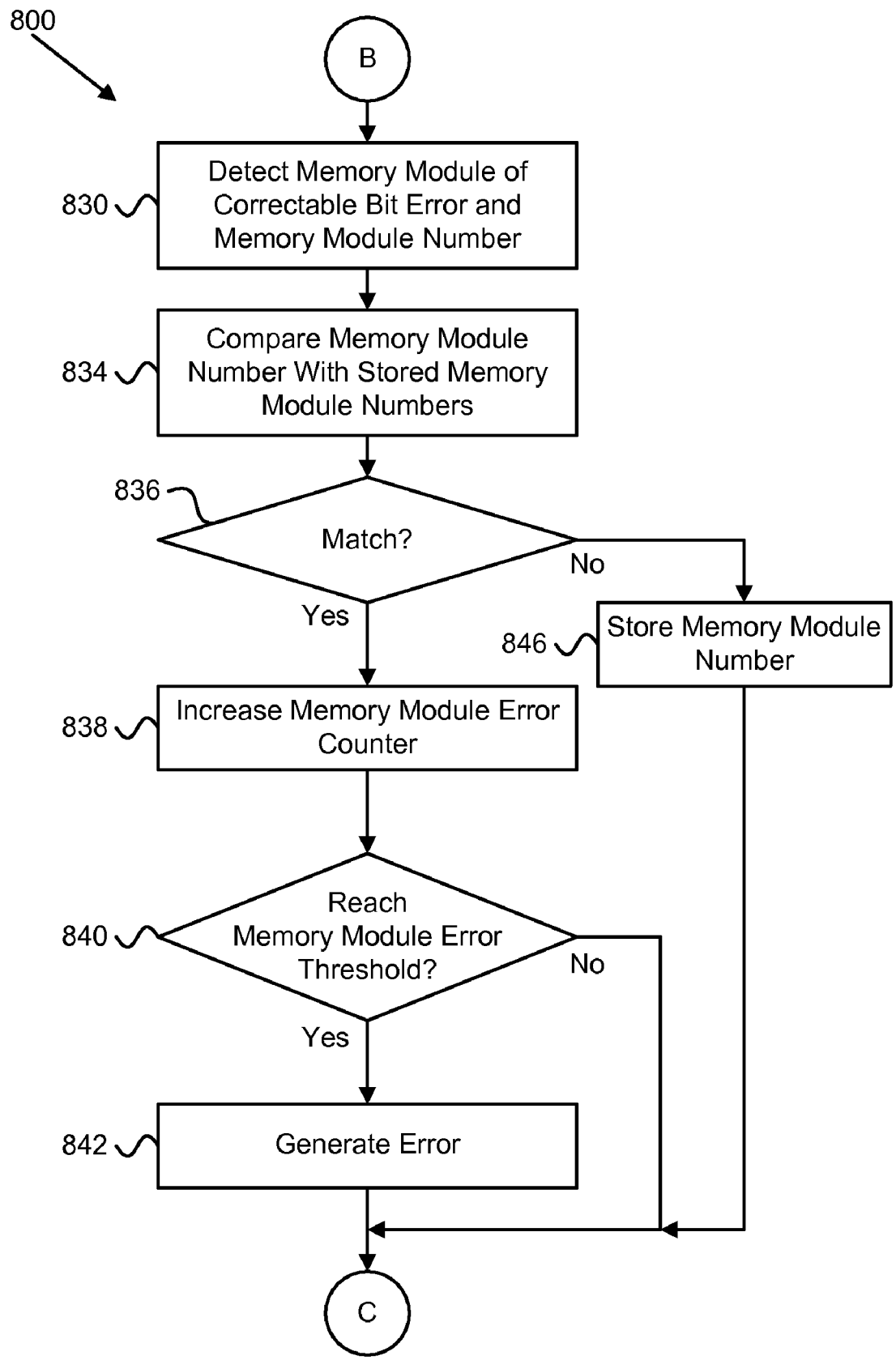
FIG. 8C is a third part of a schematic flow chart diagram illustrating another embodiment of a method for distinguishing correctable single bit errors in memory in accordance with the present invention.

If the bit line error threshold module 508 determines 826 that the bit line error counter has reached a bit line error threshold, the bit line error threshold module 508 generates 828 an error and the memory module error detection module 514 detects 830 which memory module includes the correctable bit error (follow "B" on FIG. 8B to "B" on FIG. 8C). If the bit line error threshold module 508 determines 826 that the bit line error counter has not reached a bit line error threshold, the memory module error detection module 514 detects 830 which memory module includes the correctable bit error (follow "B" on FIG. 8B to "B" on FIG. 8C). The error generated 828 by the bit line error threshold module 508 may signal that there is a bit line error, may indicate which bit line is in error, may shut down memory 204, and the like.

If the bit line comparison module 518 determines 822 that the bit location of the correctable error does not match a stored bit location, the bit line storage module 524 stores 832 the bit location and the memory module error detection module 514 detects 830 which memory module includes the correctable bit error (follow "B" on FIG. 8B to "B" on FIG. 8C). The memory module comparison module 520 compares 834 the determined memory module number with any stored memory module numbers and determines 836 if the memory module number matches a stored memory module number.

If the memory module comparison module 520 determines 836 that the memory module number matches a stored memory module number, the memory module error counter module 532 increases 838 a memory module error counter. The memory module error threshold module 510 determines 840 if the memory module error counter reaches a memory module error threshold. If the memory module error threshold module 510 determines 840 that the memory module error counter has reached a memory module error threshold, the memory module error counter module 532 generates 842 an error and the comparison module 304 determines 844 if any of the error location indicators match a respective stored error location indicator (follow "C" on FIG. 8C to "C" on FIG. 8D).

Figure 8D:
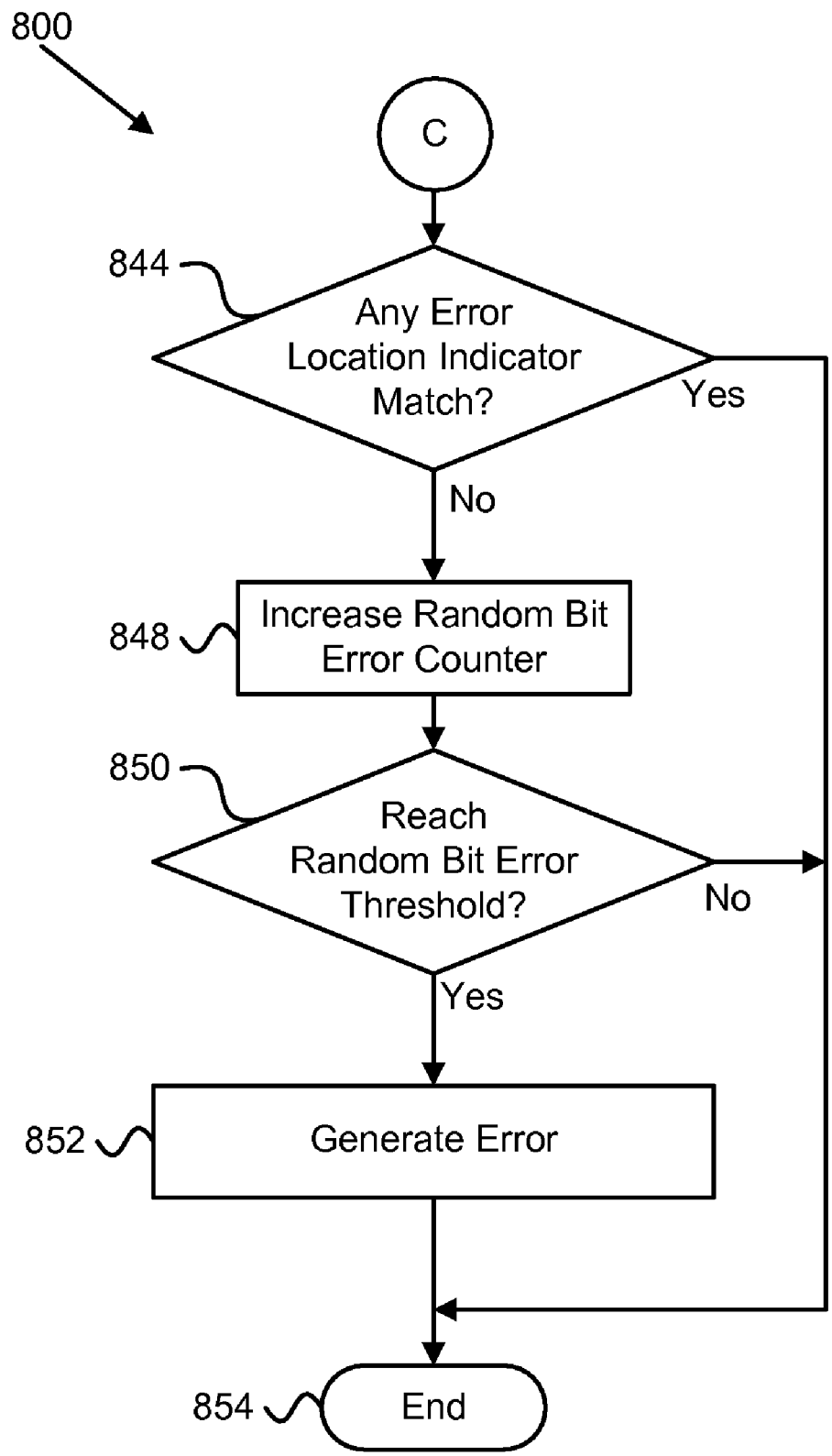
FIG. 8D is a fourth part of a schematic flow chart diagram illustrating another embodiment of a method for distinguishing correctable single bit errors in memory in accordance with the present invention.

If the memory module error threshold module 510 determines 840 that the memory module error counter has not reached a memory module error threshold, the comparison module 304 determines 844 if any of the error location indicators match a respective stored error location indicator (follow "C" on FIG. 8C to "C" on FIG. 8D). If the memory module comparison module 520 determines 836 that the memory module number does not match a stored memory module number, the memory module storage module 526 stores 846 the memory module number and the comparison module 304 determines 844 if any of the error location indicators match a respective stored error location indicator (follow "C" on FIG. 8C to "C" on FIG. 8D).

If the comparison module determines 844 that any error location indicator, such as an error address, error bit location, or memory module number, matches a stored error location indicator, the random bit error counter module 402 increases 848 a random bit error counter and the random bit error threshold module 502 determines 850 if the random bit error counter has reached a bit error threshold. If the random bit error threshold module 502 determines 850 that the random bit error counter has reached a bit error threshold, the random bit error threshold module 502 generates 852 an error and the method 800 ends 854. If the random bit error threshold module 502 determines 850 that the random bit error counter not reached a bit error threshold the method 800 ends 854. The error generated by the random bit the random bit error threshold module 502 may indicate that the data memory 204 has degraded, requires maintenance, or other suitable action.

If the comparison module 304 determines 844 that none of the error location indicators match a corresponding stored error location indicator, the method 800 ends 854. The comparison module 304 determining 844 if any of the error location indicators matches a corresponding stored error location indicators may comprise the individual comparison modules 516, 518, 520 depicted within the comparison module 304 each determining 808, 822, 836 that their respective error location indicators do not match corresponding stored error location indicators. One of skill in the art will recognize other ways to determine when to increase the random error counter based on error location indicators matching stored error location indicators.

Beneficially, the present invention solves the problems of the current state of the art associated with counting correctable bit errors. The present invention saves an error address associated with a correctable bit error and then if another correctable bit error occurs at the same location, a random bit error counter is not increased, but a memory cell error counter is increased. Thus, the random bit error counter is not increased artificially due to a single, permanent error at one location. A separate counter may be added to keep track of correctable bit errors at a particular location, or for errors at several locations that have occurred at the same locations previously. Thresholds may be used for the bit error count and for repeat error counts so that an error may be generated when a count exceeds a threshold.

In another embodiment, once a correctable bit error is detected, the particular bit in error of an error address (bit location) may be detected and compared to stored bit locations. If the bit location within a series or group of bits stored together at a memory location matches a stored bit location then a bit line counter may be increased and when the counter reaches a threshold, an error is generated. Typically the error signals that a bit line has a permanent error.

Similarly, once a correctable bit error is detected, the particular memory module 116 that includes the correctable bit error (memory module number) may be detected and compared to stored memory module numbers. If the memory module number of the memory module 116B with the correctable bit error matches a stored memory module number then a memory module counter may be increased and when the counter reaches a threshold, an error is generated. Typically the error signals that a memory module has a permanent error. Sensing and tracking repeat random bit errors, memory cell errors, bit line errors, and memory module errors offers an improvement over currently available error counters that do not distinguish between types of errors.

The present invention is also advantageous because it can operate on-the-fly without requiring special operations that access memory locations other than during normal read/write operations. Other prior art methods require verification procedures, scrubbing procedures, etc., that use computer resources to access memory locations not accessed during normal read/write operations. The present invention does not require any substantial computing overhead and may be implemented in hardware to increase speed and efficiency of the computer 202. In addition, the present invention may be implemented with an error correction and detection scheme implemented in a memory module or in a memory control function implemented outside of the memory module.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for distinguishing correctable bit errors in memory, the apparatus comprising:
   a bit error detection module configured to detect a correctable bit error in a data memory, the correctable bit error correctable using error-correcting code ("ECC");
   a comparison module configured to compare an error location indicator with a stored error location indicator, the error location indicator comprising an indication of location in the data memory of the correctable bit error, the stored error location indicator corresponding to at least one previously stored error location indicator of a previously detected correctable bit error;
   a storage module configured to store the error location indicator in response to the comparison module determining that the error location indicator differs from a stored error location indicator; and
   a random bit error counter module configured to increase a random bit error counter in response to the comparison module determining that the error location indicator differs from a stored error location indicator and to not increase the random bit error counter in response to the comparison module determining that the error location indicator matches a stored error location indicator.

2. The apparatus of claim 1, further comprising an error counter module configured to increase an error counter corresponding to the error location indicator in response to the comparison module determining that the error location indicator matches a stored error location indicator.

3. The apparatus of claim 1, wherein the bit error detection module detects a correctable bit error in response to a memory READ operation, the memory READ operation generated during normal operation of a processor in communication with the data memory.

4. The apparatus of claim 1, further comprising a random bit error threshold module configured to generate an error in response to the random bit error counter reaching a random bit error threshold.

5. The apparatus of claim 1, further comprising an error threshold module configured to generate an error in response to the error counter reaching an error threshold.

6. The apparatus of claim 1, wherein the storage module stores the error address in a register.

7. The apparatus of claim 6, wherein the register comprises a first-in first-out ("FIFO") register comprising capacity to store a plurality of error addresses.

8. The apparatus of claim 1, wherein
   the error location indicator is an error address and the stored error location indicator is a stored error address and the comparison module comprises a memory cell comparison module configured to compare the error address with a stored error address, the error address comprising a location in the data memory of the correctable bit error, the stored error address corresponding to at least one previously stored address of a previously detected correctable bit error;

the storage module comprises a memory address storage module configured to store the error address in response to the memory cell comparison module determining that the error address differs from a stored error address;

the error counter is a memory cell error counter and the error counter module comprises a memory cell error counter module configured to increase the memory cell error counter in response to the memory cell comparison module determining that the error address matches a stored error address; and a memory cell error threshold module configured to generate an error in response to the memory cell error counter reaching a memory cell error threshold.

9. The apparatus of claim 8, wherein the memory cell error counter comprises one of a plurality of memory cell error counters and wherein each memory cell error counter corresponds to a stored error address and the memory cell error counter module increases a memory cell error counter corresponding to the stored error address that matches the error address.

10. The apparatus of claim 1, wherein
the error location indicator is an error bit location and the bit error detection module comprises a bit line error detection module configured to detect an error bit location of the correctable bit error relative to bits in a memory location corresponding to the correctable bit error;

the stored error location indicator is a stored error bit location and the comparison module comprises a bit line comparison module configured to compare the error bit location with a stored error bit location, the stored error bit location corresponding to at least one previously stored error bit location of a previous correctable bit error;

the storage module comprises a bit line storage module configured to store the error bit location in response to the bit line comparison module determining that the error bit location differs from a stored error bit location;

the error counter is a bit line error counter and the error counter module comprises a bit line error counter module configured to increase the bit line error counter in response to the bit line comparison module determining that the error bit location matches a stored error bit location; and a bit line error threshold module configured to generate an error in response to the bit line error counter reaching a bit line error threshold.

11. The apparatus of claim 10, wherein the random bit error counter module does not increase the random bit error counter in response to the bit line comparison module determining that the bit location matches a stored bit location.

12. The apparatus of claim 10, wherein the random bit error counter module increases the random bit error counter in response to the bit line comparison module determining that the bit location matches a stored bit location.

13. The apparatus of claim 1, wherein
the bit error detection module further comprises a memory module error detection module configured to detect which memory module includes the correctable bit error, the memory module comprising one of a plurality of memory modules operating together as an addressable memory location in the data memory;

the error location indicator is a memory module number and the stored error location indicator is a stored memory module number and the comparison module comprises a memory module comparison module configured to compare the memory module number of the memory module with the correctable bit error with a stored memory module number, the stored memory module number corresponding to at least one previously stored memory module number of a previous correctable bit error;

the storage module comprises a memory module storage module configured to store the memory module number of the memory module in error in response to the memory module comparison module determining that the memory module number differs from a stored memory module number;

the error counter is a memory module error counter and the error counter module comprises a memory module error counter module configured to increase the memory module error counter in response to the memory module comparison module determining that the memory module number matches a stored memory module number; and a memory module error threshold module configured to generate an error in response to the memory module error counter reaching a memory module error threshold.

14. The apparatus of claim 1, wherein the bit error detection module, the comparison module, the storage module, the error counter module, and the random bit error counter are implemented in hardware and logic without code for the modules being assembled from a high level programming language and then executed on a processor.

15. A computer program product comprising a computer readable medium having computer usable program code executable to perform operations for distinguishing correctable bit errors in memory, the operations of the computer program product comprising:

detecting a correctable bit error in a data memory, the correctable bit error correctable using error-correcting code ("ECC");

comparing an error address with a stored error address, the error address comprising a location in the data memory of the correctable bit error, the stored error address corresponding to at least one previously stored address of a previously detected correctable bit error;

storing the error address in response to determining that the error address differs from a stored error address;

increasing a memory cell error counter corresponding to the error address in response to determining that the error address matches a stored error address; and increasing a random bit error counter in response to determining that the error address differs from a stored error address and not increasing the random bit error counter in response to determining that the error address matches a stored error address.

16. The computer program product of claim 15, further comprising generating an error in response to the random bit error counter reaching a random bit error threshold.

17. The computer program product of claim 15, further comprising generating an error in response to the memory cell error counter reaching a memory cell error threshold.

18. The computer program product of claim 15, further comprising detecting an error bit location of the correctable bit error relative to bits in a memory location corresponding to the correctable bit error;

comparing the error bit location with a stored error bit location, the stored error bit location corresponding to at least one previously stored error bit location of a previous correctable bit error;

storing the error bit location in response to determining that the error bit location differs from a stored error bit location; and increasing a bit line error counter in response to determining that the error bit location matches a stored error bit location.

19. The computer program product of claim 18, further comprising generating an error in response to the bit line error counter reaching a bit line error threshold.

20. A computer program product comprising a computer readable medium having computer usable program code executable to perform operations for distinguishing correctable bit errors in memory, the operations of the computer program product comprising:

detecting a correctable bit error in a data memory, the correctable bit error correctable using error-correcting code ("ECC");

detecting an error bit location of the correctable bit error relative to bits in a memory location corresponding to the correctable bit error;

comparing the error bit location with a stored error bit location, the stored error bit location corresponding to at least one previously stored error bit location of a previous correctable bit error;

storing the error bit location in response to determining that the error bit location differs from a stored error bit location;

increasing a bit line error counter in response to determining that the error bit location matches a stored error bit location; and increasing a random bit error counter in response to determining that an error address differs from a stored error address and not increasing the random bit error counter in response to determining that the error address matches a stored error address, the error address comprising a location in the data memory of the correctable bit error, the stored error address corresponding to at least one previously stored address of a previously detected correctable bit error.

* * * * *